United States Patent [19]
Hill

[11] Patent Number: 5,448,593
[45] Date of Patent: Sep. 5, 1995

[54] FREQUENCY HOPPING TIME-DIVERSITY COMMUNICATIONS SYSTEMS AND TRANSCEIVERS FOR LOCAL AREA NETWORKS

[75] Inventor: Lawrence W. Hill, Arlington, Mass.

[73] Assignee: Cyplex Corporation, Nashua, N.H.

[21] Appl. No.: 920,110

[22] Filed: Jul. 24, 1992

Related U.S. Application Data

[60] Continuation-in-part of Ser. No. 333,336, Apr. 5, 1989, Pat. No. 5,168,510, which is a continuation-in-part of Ser. No. 309,272, Feb. 10, 1989, Pat. No. 5,257,290, which is a continuation-in-part of Ser. No. 115,245, Oct. 30, 1987, abandoned, which is a continuation-in-part of Ser. No. 846,924, Apr. 1, 1986, abandoned, which is a division of Ser. No. 586,863, Mar. 6, 1984, Pat. No. 4,597,082.

[51] Int. Cl.$^6$ .......................... H04B 7/02; H04L 1/02
[52] U.S. Cl. ..................................... 375/267; 375/295; 375/345; 371/5.1; 370/60; 370/94.1; 455/226.1
[58] Field of Search ................. 375/10, 40, 98, 38, 375/109, 59, 8; 371/5.1, 5.2; 370/18, 92, 94.1, 60, 85.3, 93; 455/226.1, 226.2, 226.3

[56] References Cited

U.S. PATENT DOCUMENTS

| | | | |
|---|---|---|---|
| 4,049,914 | 9/1977 | Anderson et al. | 370/124 |
| 4,210,780 | 7/1980 | Hopkins et al. | 370/85 |
| 4,291,410 | 9/1981 | Caples et al. | 375/1 |
| 4,387,461 | 6/1983 | Evans | 371/5 |
| 4,580,276 | 4/1986 | Andruzzi, Jr. et al. | 370/24 |
| 4,756,007 | 7/1988 | Aureshi et al. | 375/37 |
| 4,823,344 | 4/1989 | Yonehara | 371/22 |
| 5,029,182 | 7/1991 | Cai et al. | 375/1 |
| 5,046,066 | 9/1991 | Messenger | 370/94.1 |
| 5,048,054 | 9/1991 | Eyuboglu et al. | 375/8 |
| 5,093,842 | 3/1992 | Gintin et al. | 375/10 |
| 5,184,349 | 2/1993 | Riordan | 375/98 |

Primary Examiner—Stephen Chin
Assistant Examiner—Amanda T. Le
Attorney, Agent, or Firm—F. Eugene Davis, IV

[57] ABSTRACT

A system utilizing adaptive frequency-hopped spread spectrum modulation to communicate over AC power lines and other noisy communications channels is described. The system employs a modulation structure in which individual packets of data are transmitted with FSK modulation using two frequencies chosen from a larger set. An error coding system is used which provides a controlling microprocessor with data on the quality of reception at each transceiver in the network; this information is used to alter the gain of the receiver, the bit rate of the transmission, and the specific frequencies employed by the network, in real time, to optimize communication error rate. Messages are organized in packets. A Master transceiver, controlling network management, transmits channel control information to other transceivers on the network, enabling system synchronization, acquisition of an existing network by new subscribers, and changes to the bit rate and frequency set in use. Each transceiver comprises a frequency controlled carrier generator, appropriate data keying for the carrier, a pair of digital detectors each having a frequency controlled bandpass filter connected thereto, appropriate microprocessors for control and broad band coupling networks for coupling the transceiver to a communications channel, which may be an AC power line, a private line, the floor loop of an automatic guided vehicle system, or the like.

11 Claims, 20 Drawing Sheets

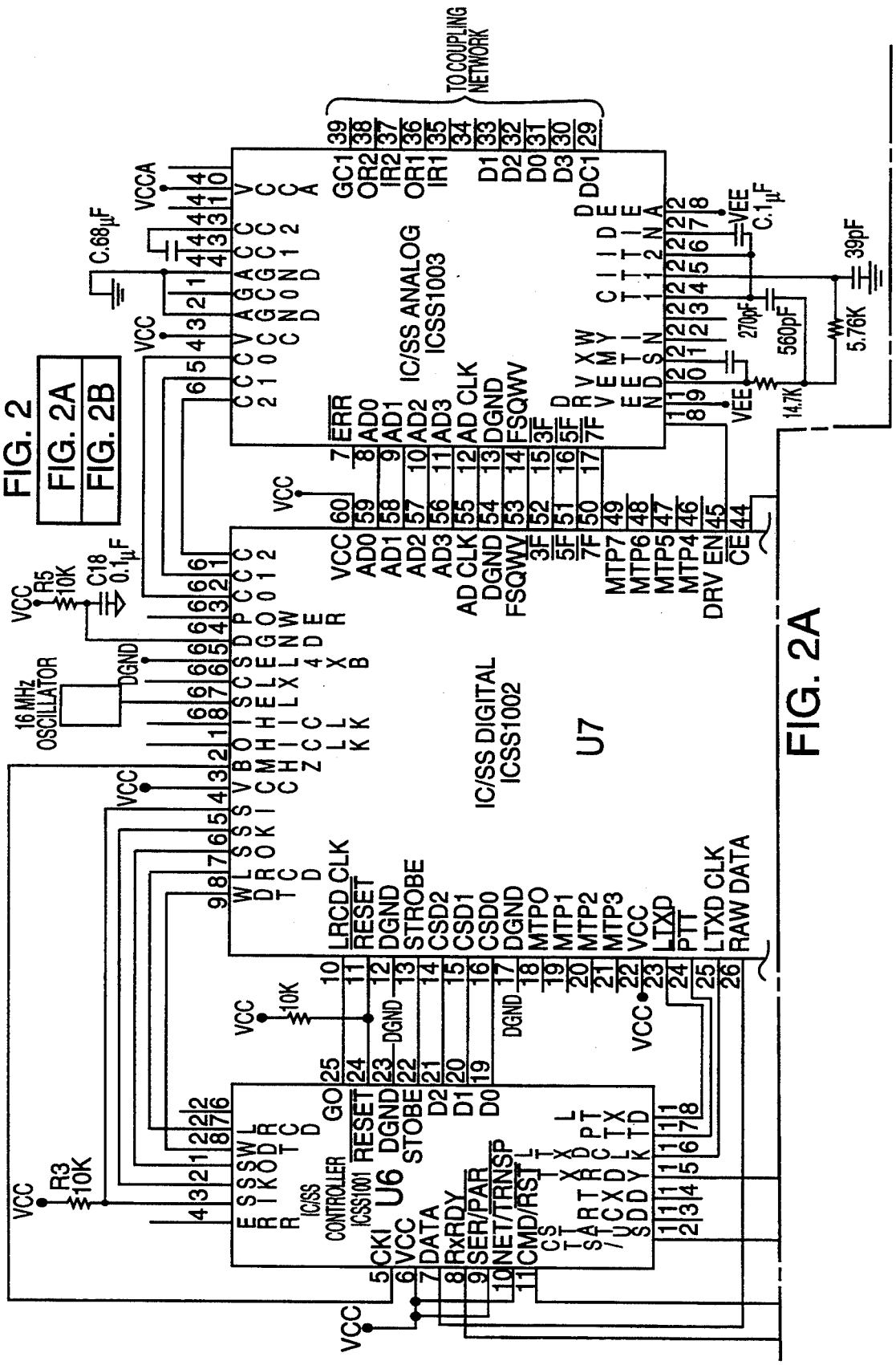

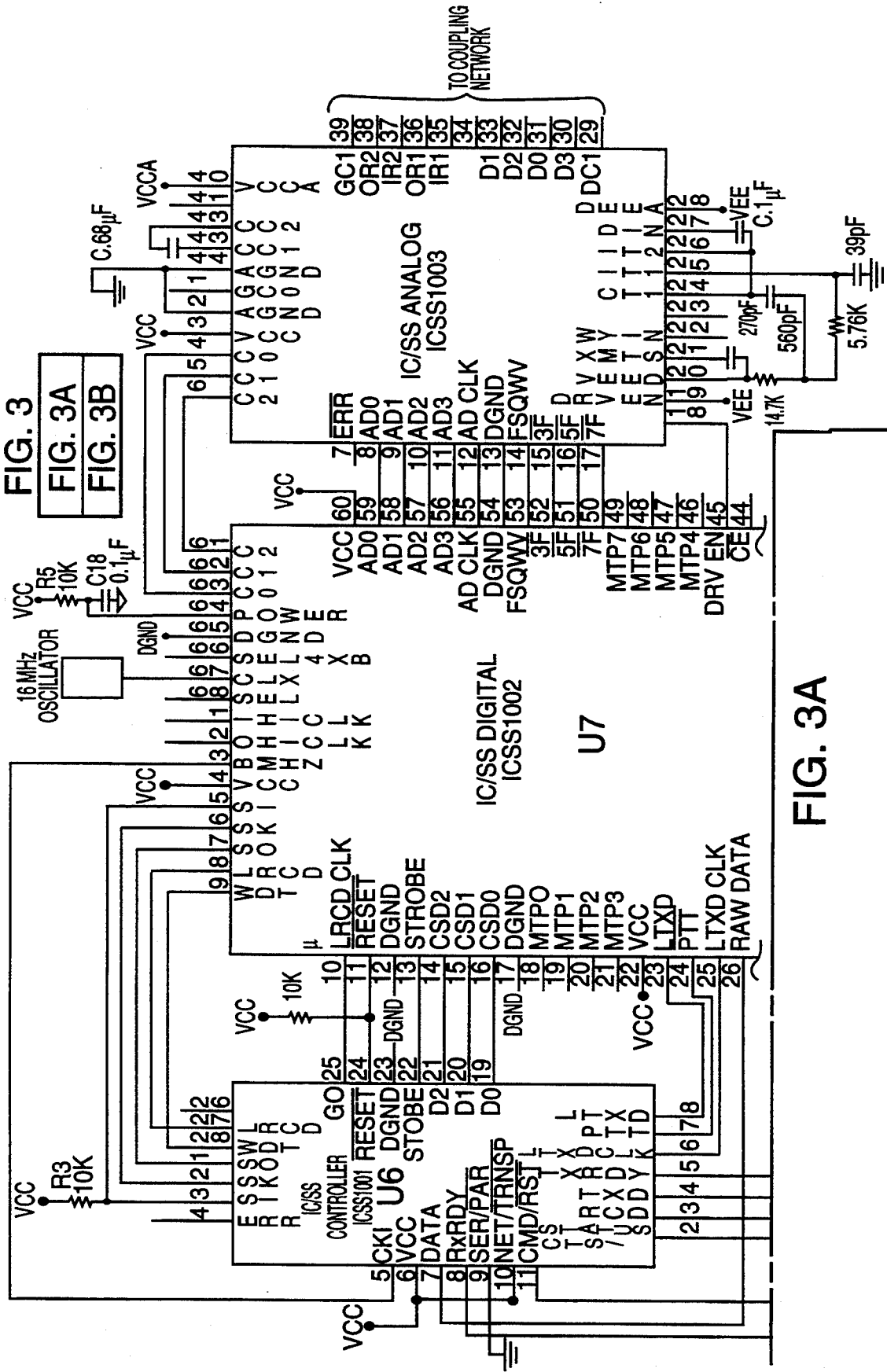

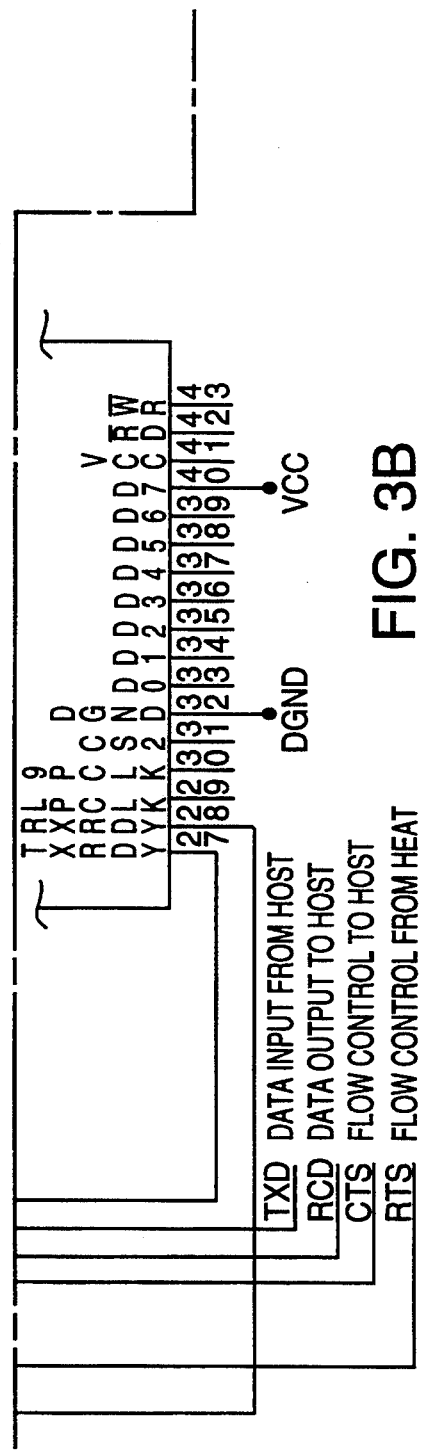

FREQUENCY HOPPING TIME-DIVERSITY COMMUNICATIONS SYSTEMS AND TRANSCEIVERS FOR LOCAL AREA NETWORKS

RELATED APPLICATIONS

This application is a Continuation-in-Part of U.S. application No. 07/333,336, filed Apr. 5, 1989, now U.S. Pat. No. 5,168,510 which application was a Continuation-in-Part of U.S. application No. 07/309,272, filed Feb. 10, 1989, now U.S. Pat. No. 5,257,290 which application was a Continuation-in-Part of U.S. application No. 07/115,245, filed Oct. 30, 1987, now abandoned which application was a Continuation-in-Part of application No. 06/846,924 of Apr. 1, 1986, now abandoned, which application was a Divisional Application of U.S. application No. 06/586,863 of Mar. 6, 1984, now U.S. Pat. No. 4,597,082, issued Jun. 24, 1986; the above applications and patent are incorporated herein by reference.

TECHNICAL FIELD

This invention relates to spread spectrum-time diversity communications systems and transceivers for multi-drop local area networks. Such transceivers may be used for communication over power lines, twisted pairs, over wires lain along the path of guided vehicles, or the like. The invention further relates to the transmission of digital data in industrial environments over transmission channels having noise characteristics influenced by the industrial environment.

BACKGROUND ART

In the above-identified U.S. Pat. No. 4,597,082, there is disclosed a transceiver for multidrop local area networks for transmission over AC transmission lines, private wire, or other less noisy transmission channels that provides error free transmissions at very high data rates in noisy industrial environments at low cost.

In the above-identified application, Ser. No. 07/115,245, there is disclosed a transceiver system for communication over wire laid along the path of guided vehicles, wherein the transmission channel, is the typical floor loop used to guide such vehicles. In Ser. No. 07/309,272, filed Feb. 10, 1989, now U.S. Pat. No. 5,257,290 entitled Transmission Line Termination of Guide-Communications Wire For Guided Vehicles, the problem of null positions in such floor loops, at which the strength of signals sent from the host modem, is so low or non-existent that communications is impossible with the guided vehicle and one solution to that problem are discussed.

The present invention is directed to eliminating such multipath problems in wire guided vehicle applications and to combating periodic impulse and slowly time varying continuous wave noise typical of wire guided vehicles, power line carrier transmission systems and other transmission channels in an industrial environment.

While, according to the prior art, spread spectrum (frequency hopping) systems and time diversity techniques have been utilized to overcome transmission problems caused by random noise, which may be natural or caused by jamming, such techniques have not been utilized in low cost systems, which are oriented towards adaptive avoidance of inadvertent man-made noise, such as in the industrial environment. Such noise is time varying, but not truly random.

DISCLOSURE OF THE INVENTION

The transceivers of the present invention use adaptive frequency hopping to eliminate the effects of multi-path and standing waves and to avoid time-varying continuous wave noise. The transceivers also utilize error correction coding to combat impulse noise.

In one embodiment of the invention, 8 frequencies are utilized in a frequency band from 20 kHz to 90 kHz. These frequencies are chosen, such that the side bands of the frequencies, when modulated as described herein, do not overlap. Manchester encoding of the digital bit stream is employed, wherein a transition between carrier frequencies occurs once per bit.

Each information byte of consists of eight information bits plus one parity bit providing limited error detection. The entire packet is also protected by a 27 bit error detection code.

The transceiver according to the invention is provided with a protocol program and an I/O program, which may operate on separate microprocessors or through time sharing on a single processor. In the transmit mode, the I/O program transmits a frequency code to a digital counter which changes its counting modulus so as to produce the correct frequency for transmission, which is then gated and wave-shaped under control of data supplied by the physical I/O program.

During reception, the I/O program provides a frequency code to a pair of frequency controlled filters which pass the appropriate frequency to the digital filters, which use the appropriate clock signals derived from the clock logic to receive the transmitted frequencies.

According to the invention, detection of an uncorrectable error after the spread spectrum transmission of a data block will cause the receiver to transmit an error message to the sending transceiver, which will retransmit the data block. When a block is received with such an uncorrectable error in one or more bytes, the correct bytes are stored in a buffer, so that when the repeated transmission is received, it is only necessary that those bytes having errors the first time be received correctly the second time. In such a case, the final 27 bit error detection code is used to verify that the combination of multiple partially received transmissions has occurred correctly. Thus, it is possible for the receiver to correctly receive a block, even though that block is never received without errors. Means are provided for initializing the system so that all transceivers are operating on the same pair of frequencies at the same time.

Means are provided for measuring the raw bit error rate; Receiver gain is adjusted based upon the measured error rate performance.

In the event that gain adjustment does not produce an acceptable error rate, the data rate in use is reduced. If, after reduction to the lowest implemented data rate, the error rate is still unsatisfactory, a different transmission frequency will be employed. Similarly, good error performance will result in an increase in data rate. Information on bit rate and frequency is conveyed to all subscribers on the network through the channel control field in the message packet.

The data packets transmitted contain a master address field, which may be used to provide for multiple, frequency-division multiplexed networks functioning concurrently on the same physical transmission medium. Means is provided in the frequency shifting algorithm to treat transmissions with a different master address in the same way as noise, resulting in automatic switching to a different frequency.

The hardware to implement this invention consists of five elements, shown in simplified block diagram form in FIG. 1. A schematic of the actual circuitry is shown in FIGS. 2 through 5.

The major elements of the design are:

The control microprocessor, which implements the channel control algorithms described above, controls external interfaces, and implements physical, link, and network layer protocols.

The digital subsystem, which includes hardware for the external interfaces, timing and clock generation logic, transmit signal generation logic, and the digital portion of the receiver, including digital filtering and data recovery.

The analog subsystem, including a broad-band, high-gain front end with digital control of the gain in multiple steps, an Analog to digital converter for the signal, and analog circuitry to feed and control the transmit power amplifier.

External components, including host interface circuitry, coupling to the AC power line, impulse protection circuitry, and the transmit power amplifier.

OBJECTS OF THE INVENTION

It is therefore an object of the invention to provide improved communications in an environment of slowly time varying continuous wave noise and constant frequency impulse noise.

Another object of the invention, is to provide such communications utilizing spread spectrum and time diversity techniques.

A further object of the invention, is to provide for such communications in industrial environments over power lines, dedicated pairs, automated guided vehicle floor loops, and similar noisy transmission channels.

Another object of the invention, is to increase the data rates in such communications.

A still further object of the invention, is to reduce error rates in such communications.

Another object of the invention is to provide a technique for data communication and ranging which can be implemented in inexpensive integrated circuit form and which will exhibit very high resistance to impulsive and continuous-wave noise interference.

A further object of the invention is to provide a reliable means of communication over AC power lines, which exhibit such noise characteristics.

Other objects of the invention, will in part be obvious and will in part appear hereinafter.

The invention accordingly comprises the features of construction, several elements, the arrangements of parts, and the choice of functions and signals, which will be exemplified in the construction of the systems hereinafter set forth. The scope of the invention is indicated in the claims.

BRIEF DESCRIPTION OF THE DRAWINGS

For a fuller understanding of the nature and objects of the invention, reference should be had to the following detailed description, taken in connection with the accompanying drawings, in which:

FIG. 3 is a diagram showing how FIGS. 3A and 3B may be fit together to form a Figure which is a schematic circuit diagram of the chip set of FIG. 1 connected for serial communication with the host of FIG. 1;

The same reference characters refer to the same elements throughout the several views of the drawings.

BEST MODE FOR CARRYING OUT THE INVENTION

This section describes the specific design of the system in detail.

The hardware is first discussed in detail with reference to a chip-level schematic, and then in more detail, referring to the internals of the chips.

The operation of the software algorithms controlling operation of the system are then described, first in general terms and then in detail with reference to specific routines.

HARDWARE SYSTEM DESCRIPTION

Figure 1:
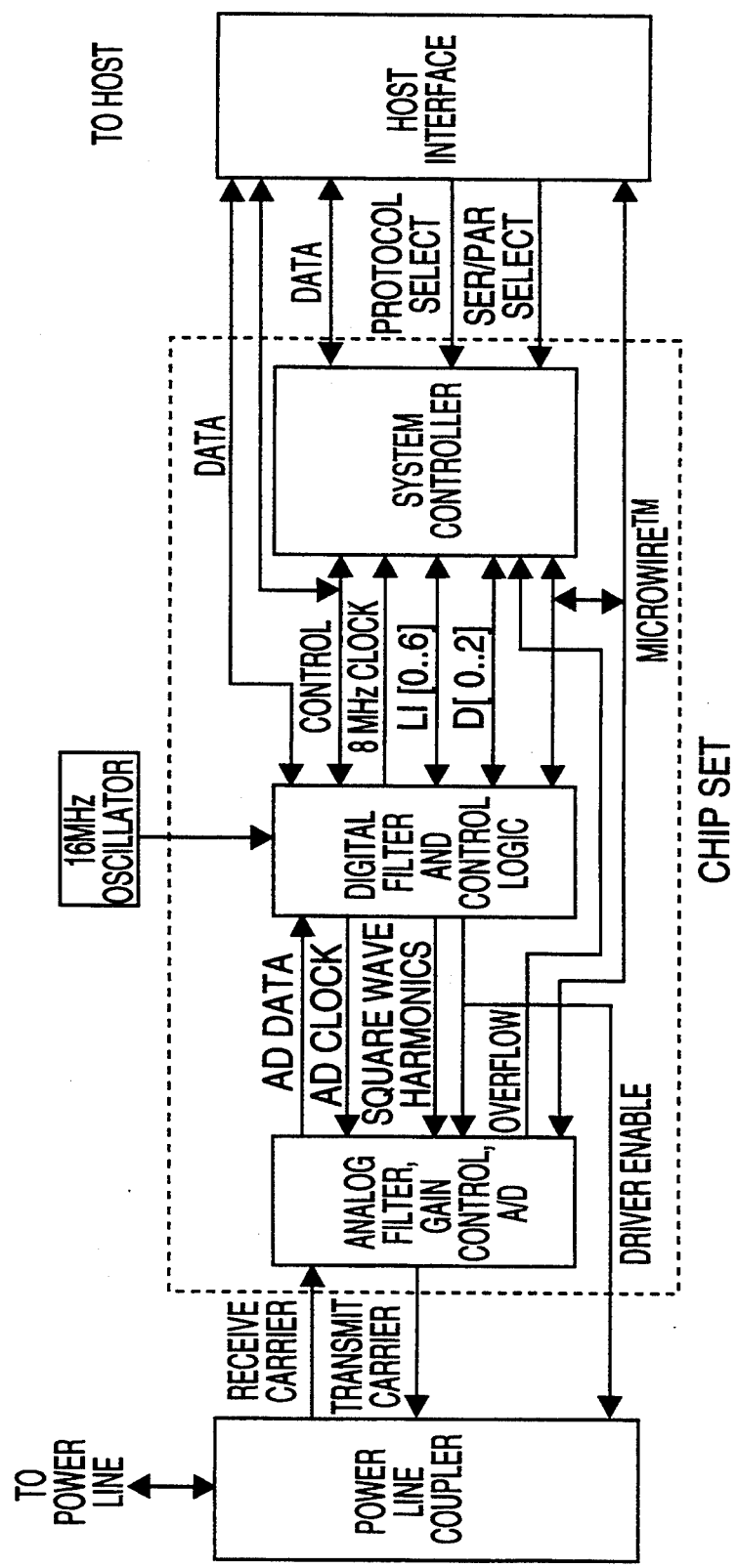
FIG. 1 is a block diagram of a spread spectrum time-diversity communication system transceivers according to the invention.

This section describes major hardware elements of the system. FIGS. 2 through 5 comprise a schematic of the system, and partition it into the functional blocks shown in FIG. 1.

CONTROL MICROPROCESSOR

Figure 2B:
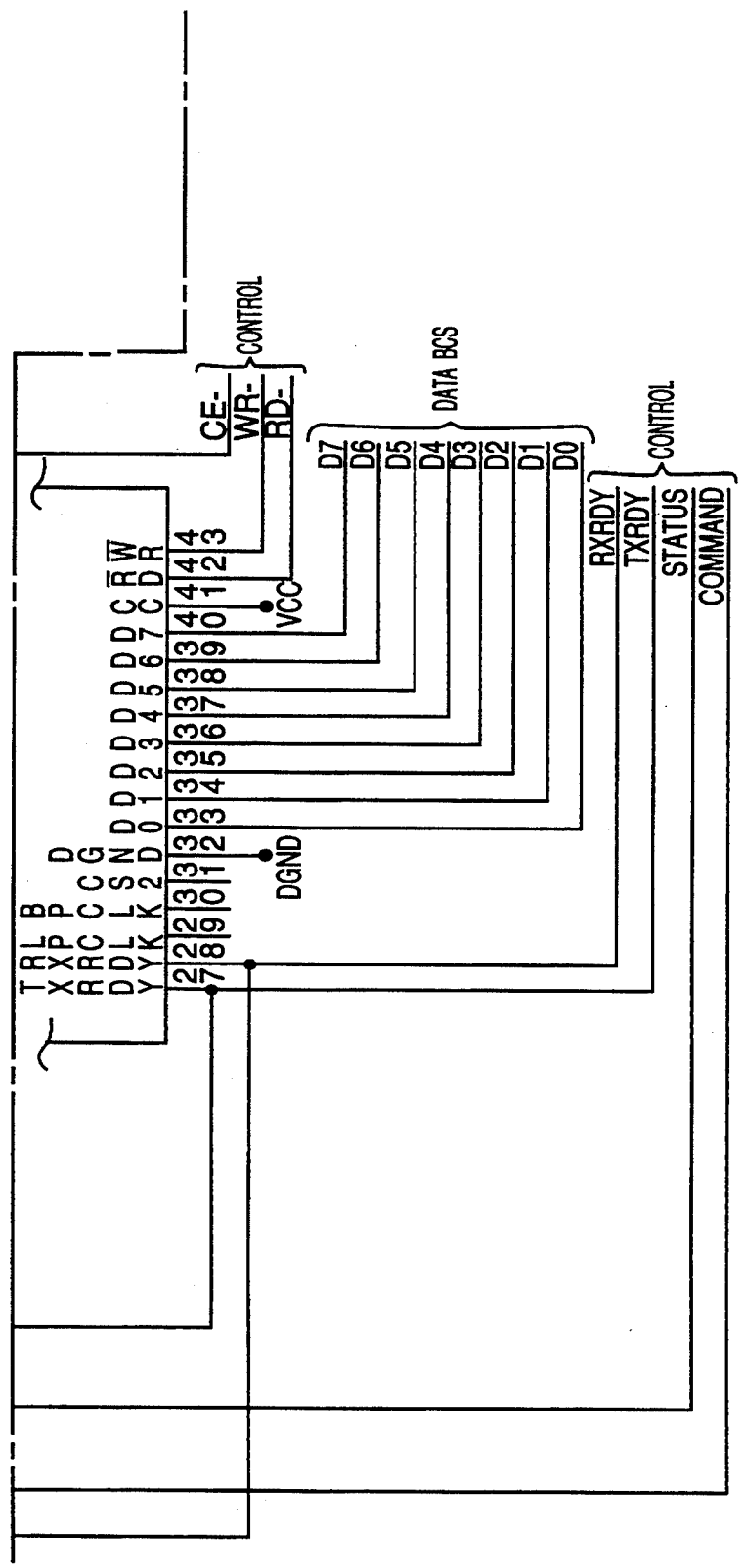
FIG. 2 is a diagram showing how FIGS. 2A and 2B may be fit together to form a Figure which is a schematic circuit diagram of the chip set of FIG. 1 connected for parallel communication with the host of FIG. 1.
Figure 4:
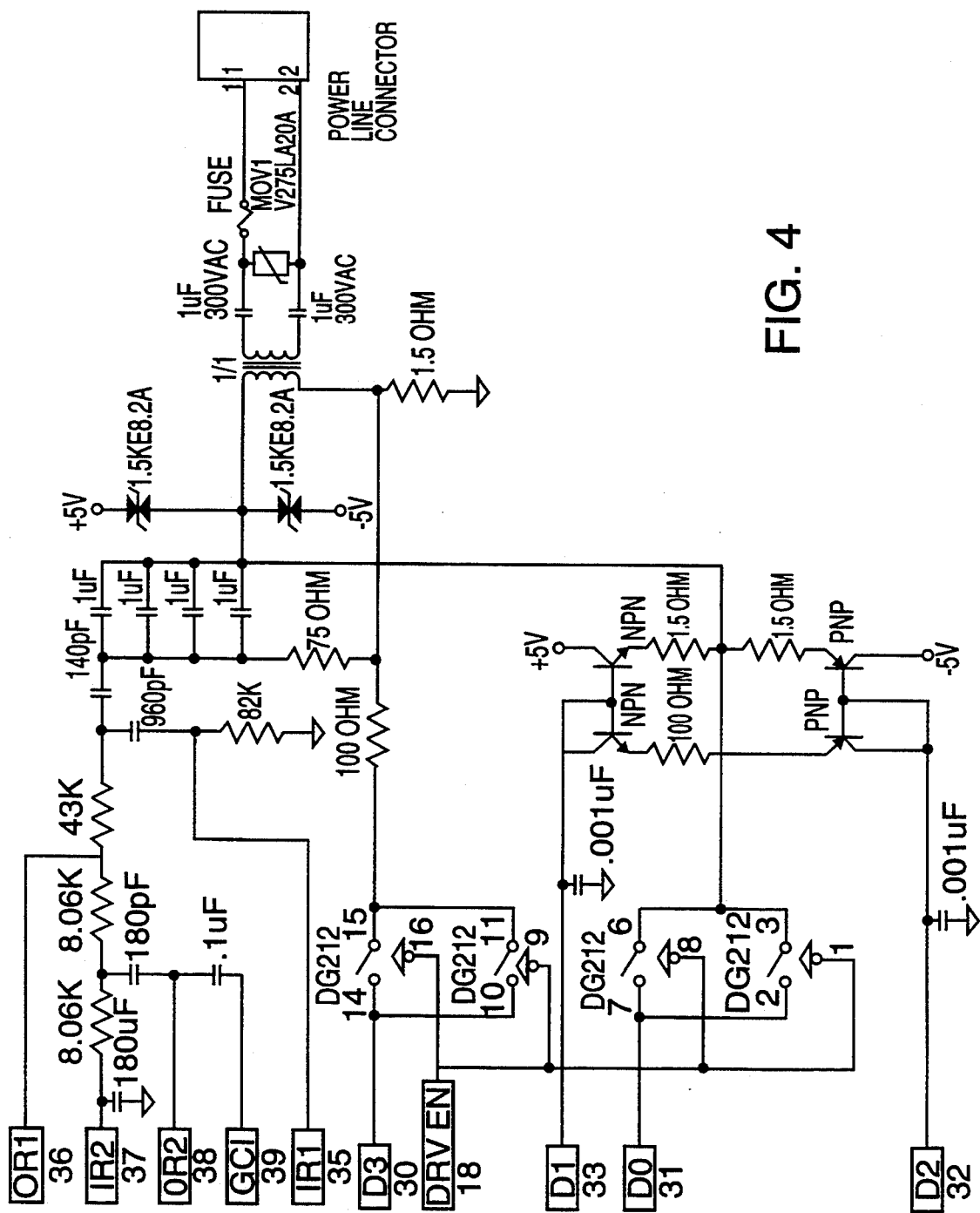
FIG. 4 is a schematic circuit diagram of the power line coupler of FIG. 1.

A National COP-series microprocessor, U6 of FIG. 2, is employed. It interfaces primarily to the digital chip, U7 of FIG. 2, but in addition there are several pins connecting to the host interface. Host interface pins are:SER/PAR, NET/TRANS, which are strapped by the user to indicate unit configuration; RXRDY, TXRDY, which relate to an 8-bit parallel interface to the user; RTS/COMMAND, CTS/STATUS, RCD, and TXD, which comprise a serial interface to the user with bidirectional flow control.

Interfaces to the digital chip include a RESET; SO, SI, and SK are used in the standard Microwire serial interface configuration described by National Semiconductor; RAW DATA, received data prior to Manchester decoding, LRCD and LTXD clocks for receive and transmit, PTT to control direction (receive or transmit); and WDT, a watch dog timer which shuts the system down in the event of certain failures.

Other information related to bit rate and frequencies is transferred to the digital chip via the microwire interface.

DIGITAL SUBSYSTEM

Figure 6:
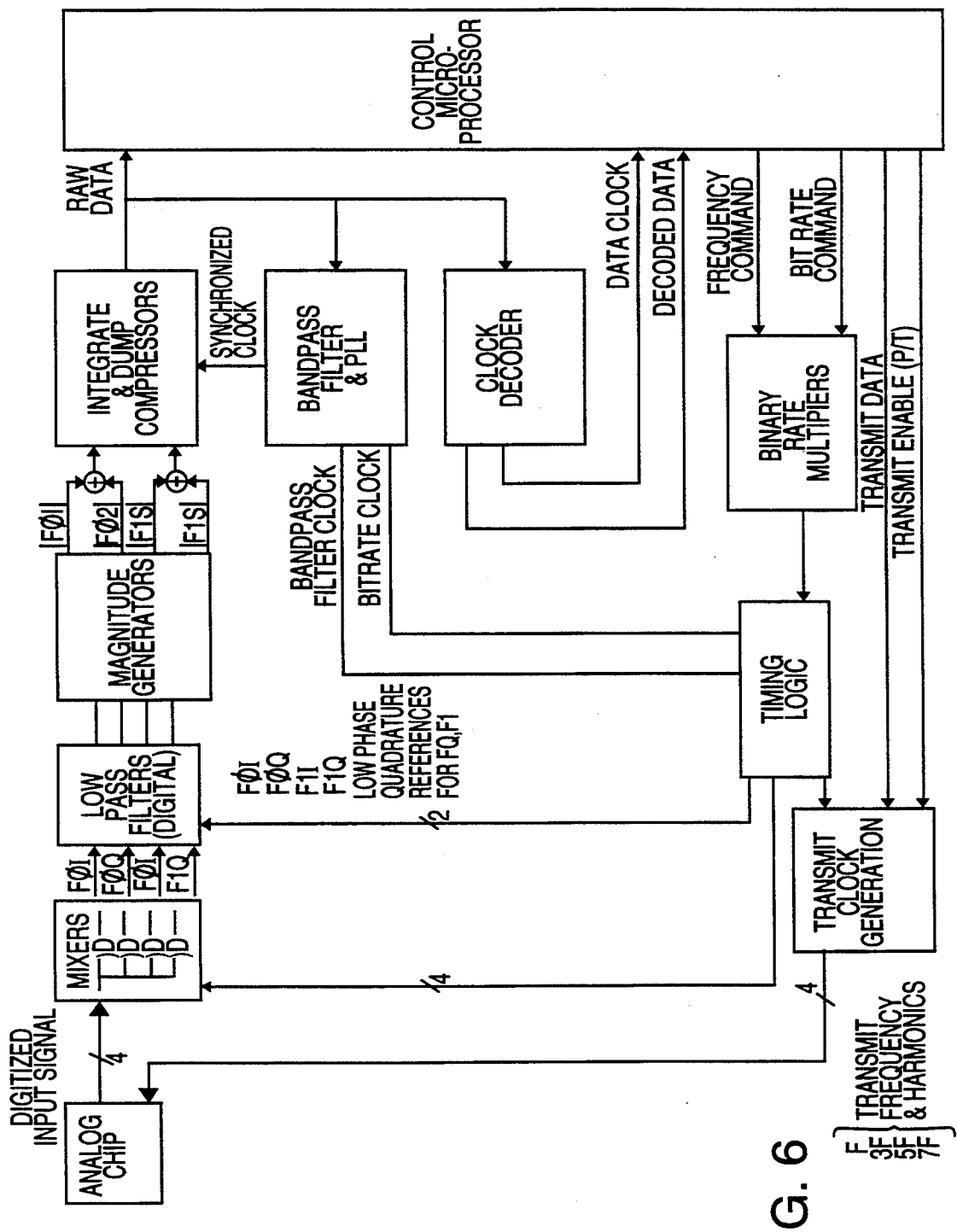
FIG. 6 is a detailed block diagram of the digital chip and digital subsystem of FIG. 1.

The digital chip is shown in block diagram form in FIG. 6.

The system is driven by an external 16 MHz crystal. The crystal clock feeds a pair of binary rate multipliers, whose output frequencies are controlled by data written into their counters by the control microprocessor. The output of the binary rate multi pliers feeds a timer chain which generates two designated carrier frequencies, as well as their third, fifth, and seventh harmonics These harmonics are added together with the fundamental carrier, appropriately weighted, in the analog chip to produce a nearly sinusoidal carrier. In addition, several clocks are derived for data reception and decoding: for each of the two designated frequencies, both in-phase and quadrature clocks are developed; and clocks for the low pass filters and for the bandpass filters are generated, whose frequency is determined by the bit rate commanded by the microprocessor.

Transmission is controlled by the microprocessor, through PTT (push-to-talk) pin which enables output, and through the data pin which controls the output of one or zero. Data provided by the microprocessor is manchester-encoded by the microcontroller, which outputs the appropriate carrier sequence together with its harmonics.

The received signal enters the digital chip as a 3-bit digitized signal, plus overflow from the analog chip's A/D converter. This data is run in parallel through four mixers, for in-phase and quadrature components of each of the two designated frequencies. These are implemented by exclusive-OR of the input with the clocks.

The I and Q components are then run in parallel through four low-pass filters, to generate magnitude signals for each. The results are fed to a system of comparators, which compares the sum of I and Q energy on each of the two frequencies, and outputs a signal corresponding to the frequency with higher energy. This is a representation of manchester-encoded data; it is decoded and output as data to the microprocessor (manchester-encoded data is also available to the microprocessor, but is not currently used).

Bit synchronization is obtained through a bandpass filter feedback loop, which uses an initial synchronization pattern at the beginning of each packet to lock onto the f0-f1 transitions in the received signal, and synchronizes the integrate-and dump function in the comparator and the Manchester decoding accordingly.

ANALOG SUBSYSTEM

Figure 7:
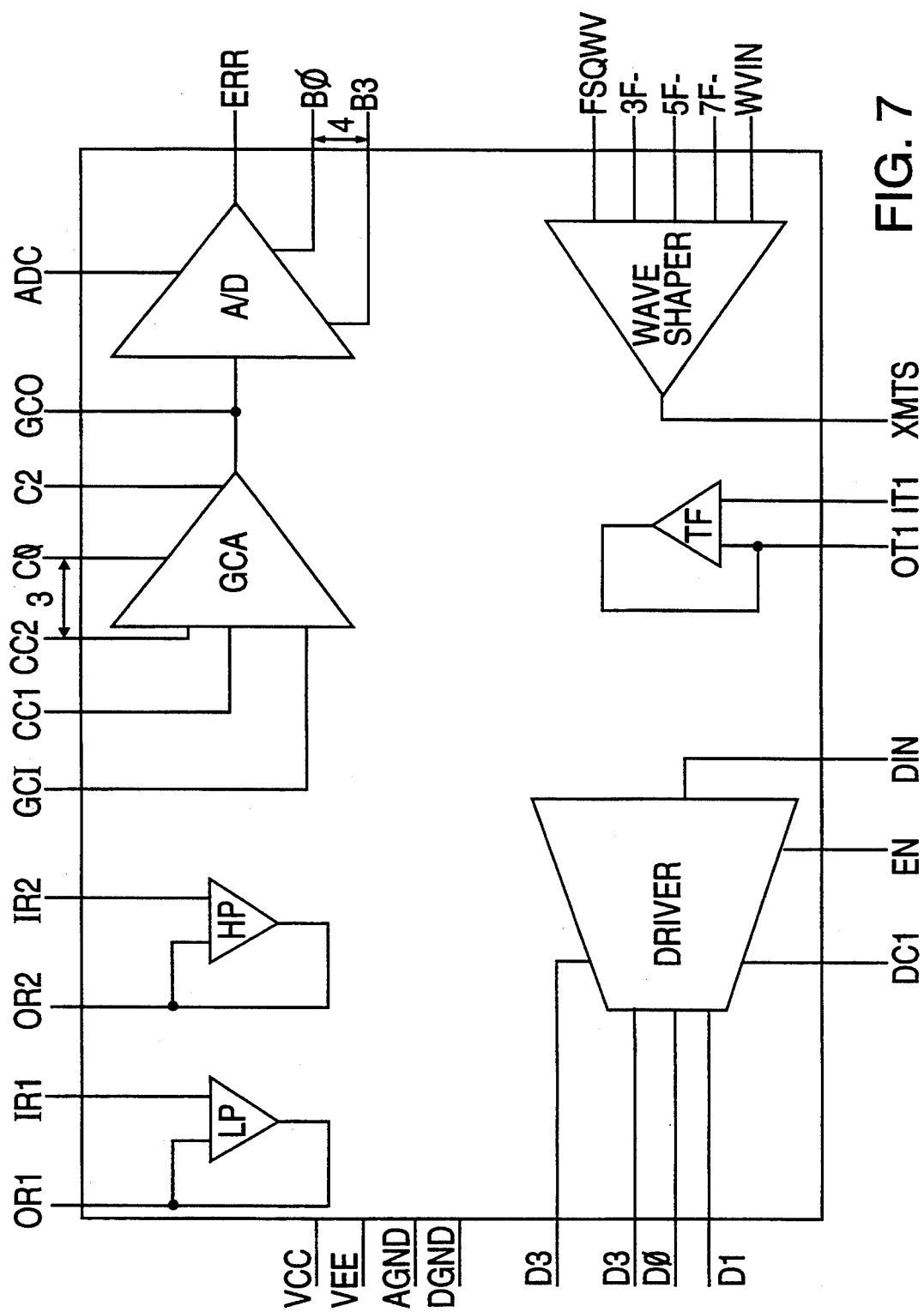
FIG. 7 is a detailed block diagram of the analog chip of FIG. 1.

FIG. 7 is a block diagram of the analog chip. It shows the receive filter broadband operational amplifiers, which are connected through external resistors and capacitors as shown in FIG. 3. The broadband filtering is accomplished through series low pass and high pass elements. Inputs C0 through C2 switch difference values of feedback resistors into the gain path, permitting gain to be set in 8 db steps from 3 to 60 db. This signal is then fed to the A/D converter, an conventional flash converter design clocked at 1 Mhz. (Its digital portion is in the digital chip 11.

On the transmit side, FSQWV, 3F, 5F and 7F clocks are combined in the wave-shaper, which adds them together with appropriate relative gain to approximate a sine wave of frequency of FSQWV. This is passed through an additional filter stage, and then to the driver which interfaces to the external power amplifier/driver stage.

TRANSMIT CARRIER POWER AMPLIFIER

This section amplifies the output of the transmit carrier generation logic and applies it to the AC line coupling network. It consists primarily of Q1 through Q4 shown on FIG. 4, and is straightforward.

AC LINE COUPLING NETWORK

Figure 5A:
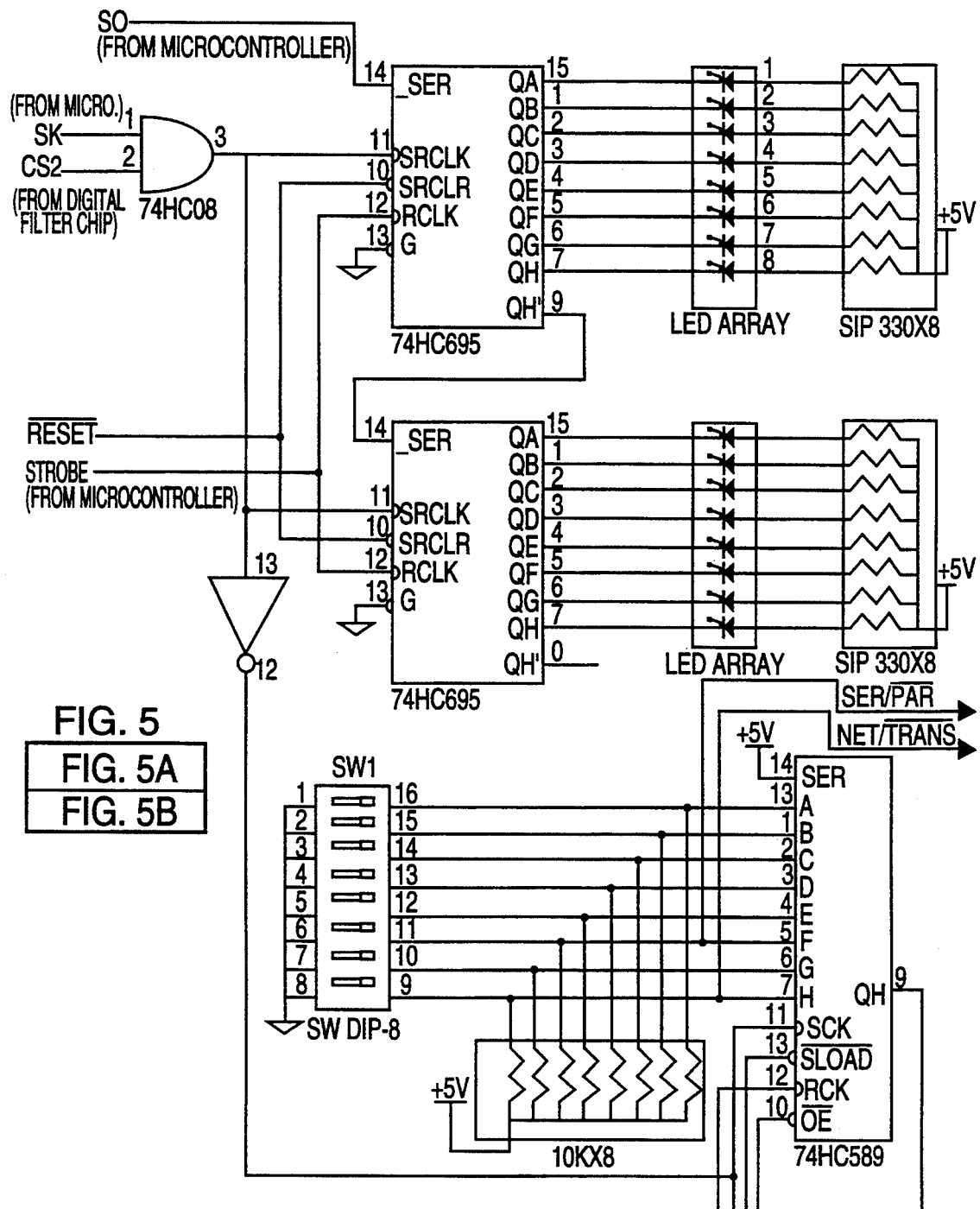
FIG. 5 is a diagram showing how FIGS. 5A and 5B may be fit together to form a Figure which is a schematic circuit diagram of configuring switches and light emitting diode indicators connected to the chip set of FIG. 1.
Figure 5B:
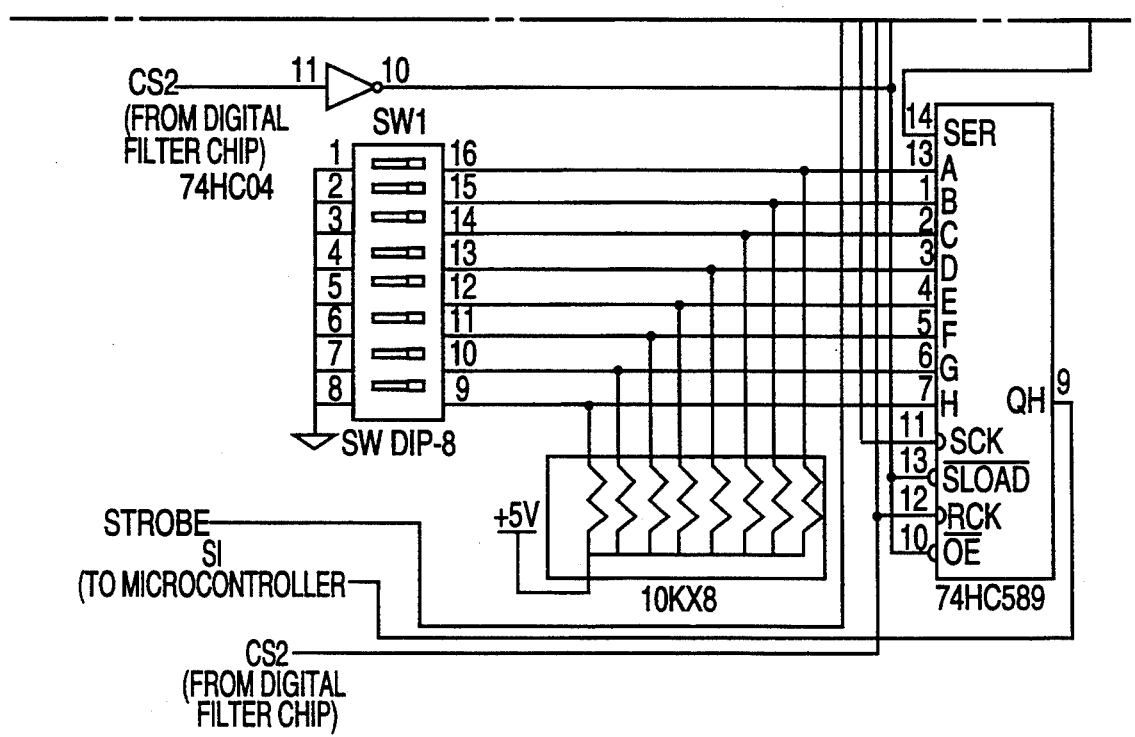

This passive network provides coupling to the AC-line. It is designed to provide relatively little voltage drop and phase distortion when presented with the power line's impedance at 20 to 90 KHz. It is shown in FIG. 5.

For input signals from the AC line, the coupler is designed to attenuate 60 Hz by at least 100 db, provide reasonably flat frequency response across the operating range of 9-90 KHz, present a high impedance to the line in the operating frequency range, and avoid ringing in response to high energy impulse noise. Protection is provided by MOV1, D1,D2, D3.

SUPPORTING HARDWARE

The board version of the system includes a power supply, and various LEDs and dip switches intended to facilitate installation. These are detailed in FIG. 4.

PHYSICAL LAYER OPERATION: NETWORK CONTROL SYSTEM

This section describes the processes involved in control of physical layer communications. The processes discussed are:
 Frequency hopping control
 Gain optimization
 Bit rate optimization
 Frequency optimization
 Synchronization and network acquisition
 Error coding and time diversity Together, these processes comprise a feedback control system which causes communications to operate in that portion of the available spectrum which will permit the greatest data rate to be used with acceptable error rate.

Figure 8A:
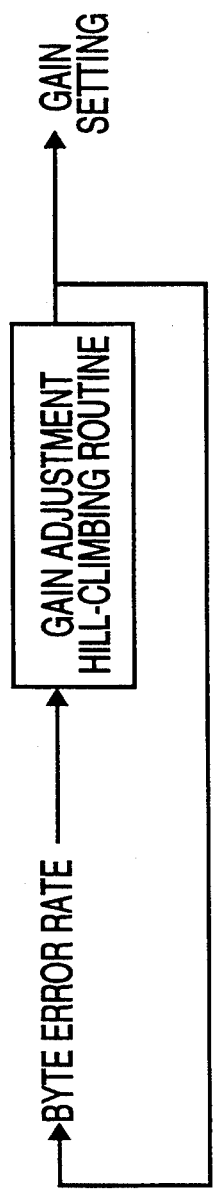
FIG. 8A is a conceptual block diagram of the gain setting logic of the invention.
Figure 8B:
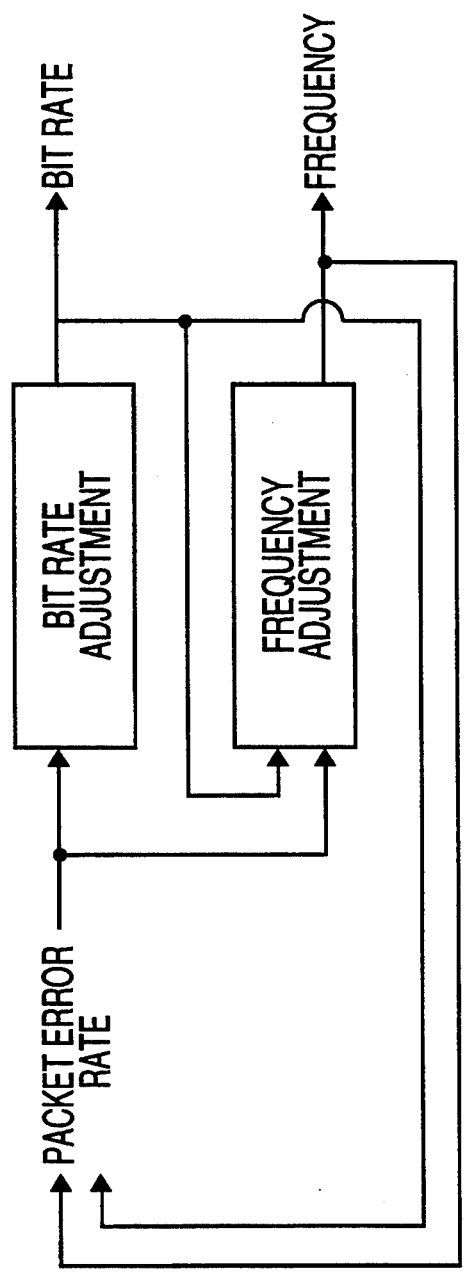
FIG. 8B is a conceptual block diagram of the bit rate and frequency choosing logic of the invention.

The general structure of the feedbackloops is shown conceptually in FIG. 8.

FREQUENCY HOPPING CONTROL (BIT LEVEL)

This section describes the spectrum allocation, the coding of information bits, and the processing required for system management at the bit level.

Spectrum Allocation

Consistent with the CENELEC proposed standard, the system will operate within the band of 9-90 KHz.

Another consideration in the choice of frequencies is that they be so spaced that the principal harmonics of one do not lie close to another, so that distortion in the transmitted waveform of one carrier will not cause interference with another frequency channel. At the same time, it is necessary that these be generated from a common high-speed clock with different divisors, in order to maintain reasonable simplicity in the timing logic.

Definition of Tunes

Each bit is encoded as a combination of two frequencies, together comprising a manchester-encoded bit of information. It is desirable to set up the channels to be contiguous but nonoverlapping, to take full advantage of the available spectrum without making two adjacent channels vulnerable to the same single-frequency noise source. This leads to the following frequency allocation:

| tune | f0 (Hz) | f1 (Hz) |
|---|---|---|
| 0 | 76200 | 50800 |
| 1 | 57142 | 38095 |
| 2 | 42857 | 28571 |
| 3 | 32142 | 21428 |

Tune Control

The microprocessor will load a code for each of the two frequencies of the current tune.

AUTOMATIC GAIN CONTROL

The gain associated with each frequency is adjustable, based on bit error rate as measures over a small number of packets. This section describes the process.

In the master, this loop is fast compared to the bit rate and frequency change loop; that is, changes to gain are made more readily than changes to bit rate and frequency, to avoid thrashing between the two dimensions of the system.

Upon reset, prior to network acquisition, the gain is set at its middle value. It is then adjusted based on the occurrence of bytes received in error, as determined by the parity bit. A change is made to the gain after each four packets received. Since a gain setting either too high or too low will produce inferior performance, a two-step peak-finding algorithm is used:

1. measure error rate at current gain value
2. change gain and measure error rate
3. if error rate is better, change gain again in same direction; if error rate is worse, return to previous setting (peak found)
4. when a peak is found, stay at same setting for 16 packets, then repeat process.

Figure 9A:
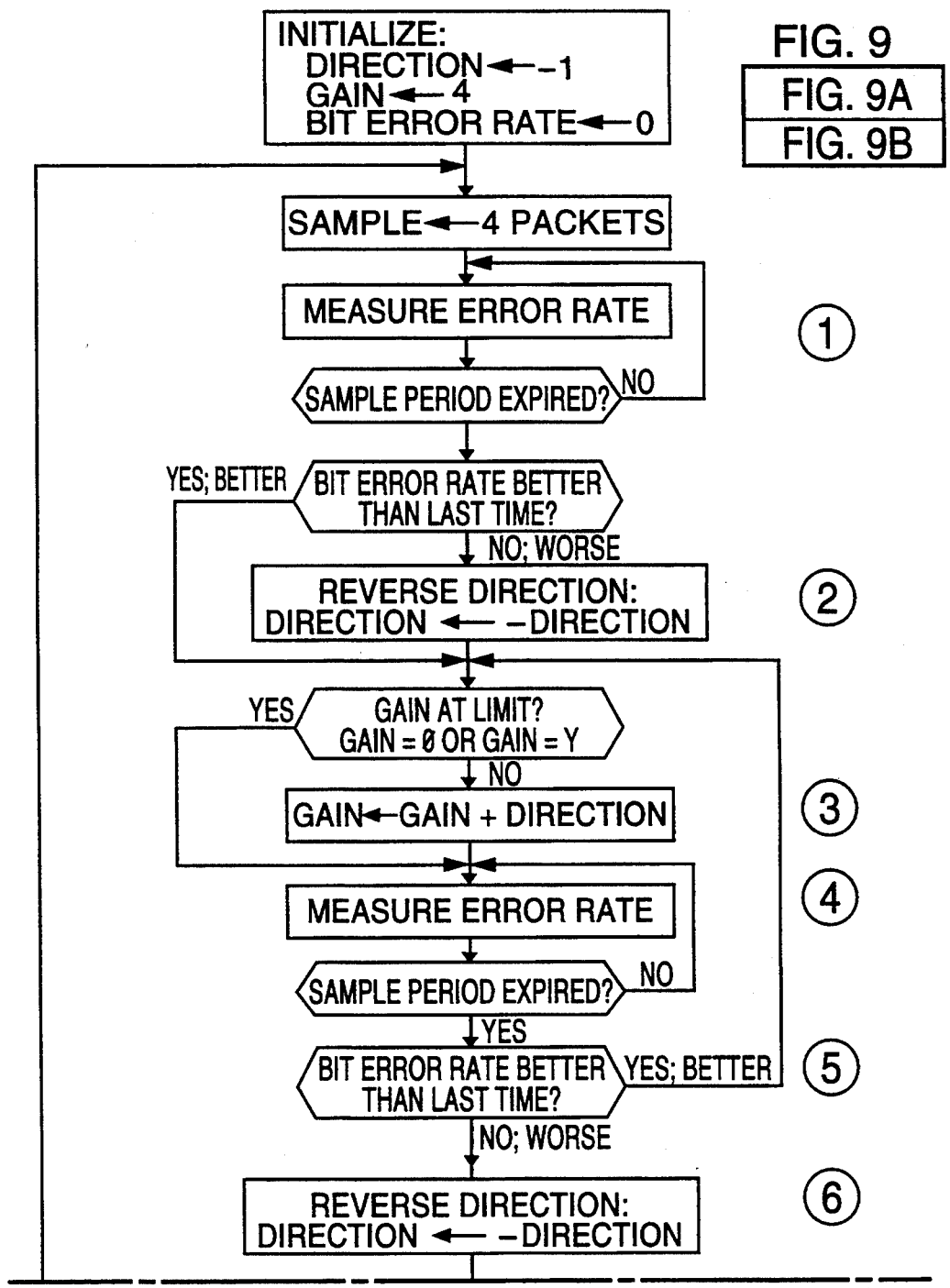
FIG. 9 is a diagram showing how FIGS. 9A and 9B may be fit together to form a Figure which is a flow chart of the gain control logic of the system shown in FIG. 1.
Figure 9B:
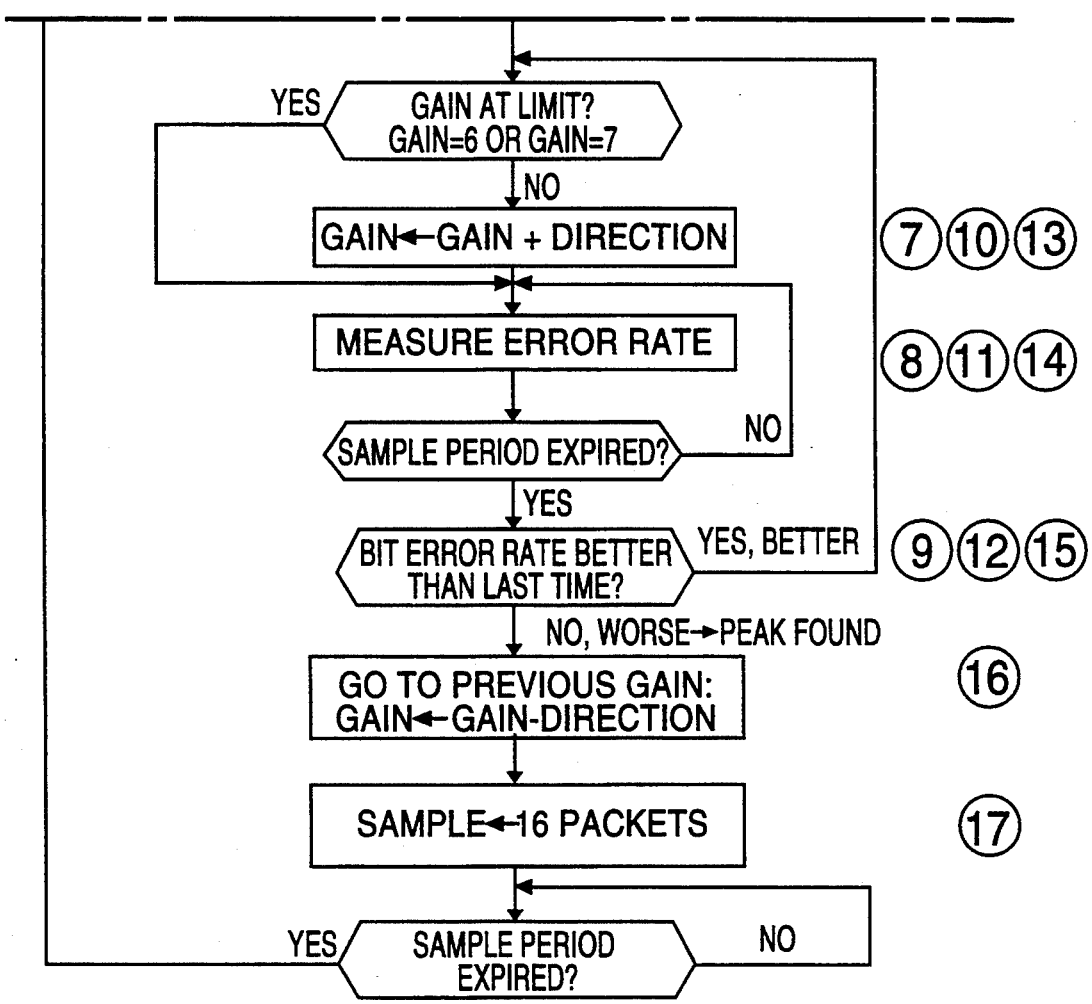
Figure 10:
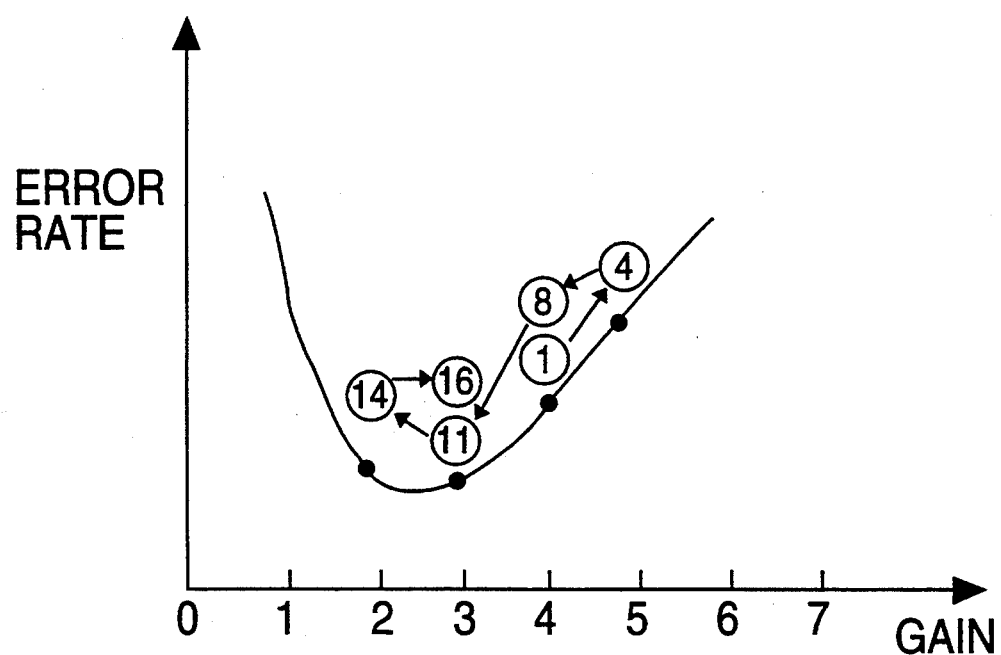
FIG. 10 is a graph of error rate versus gain illustrating operation of the gain control logic.

This process is described in greater detail in FIG. 9, a flow chart for the gain control algorithm, and FIG. 10, a chart showing the sequence of gains which would be chosen with a hypothetical but typical relationship between gain and error rate. The curve in FIG. 11 indicates an optimum gain between gain=2 and gain=3, with worse performance at either higher or lower values of gain. This is typical of actual performance, since too high a gain will saturate the receiver with noise, while too low a gain will place the signal below the receiver's threshold. The numbers in circles on both figures indicate the sequence of events:

The system starts operating at a gain of 4, and measures the error rate for four successive received packets (1). Upon initialization, the variable "bit error rate" was set to zero, so when the new measurement is compared to the previous bit error rate, it will be worse (2). This causes the variable "direction" to be reversed in sign, it is then +1. Thus, the gain is incremented to a value of 5, (3) and error rate is measured for another four packets (4). In our example, a worse measurement is obtained, causing direction to be again reversed to −1, (6) and gain set to 4, (7). The next measurement (8) produces another improvement in error rate (9), so gain is again decremented (10) to 3. The next measurement (11) again improves gain (12), and gain is again decremented (13) to 2. Now the optimum has been passed, the next measurement (14) is worse than the preceding one, so gain is incremented instead of decremented, not to a value of 3, (16). The system, having found the peak, now stays at this value of gain for 16 packets, instead of four, and then repeats the entire process. This longer sample time after a peak is found improves the systems performance, because less time is spent at the sub-optimal gain values surrounding the peak. The length of the on-peak sample time is limited, however, by the need to make the system responsive to frequent changes in the ambient noise environment, and in received signal strength.

BIT RATE OPTIMIZATION

The slave controls its gain autonomously, but changes bit rate and frequency only in response to a command from the master, or during network acquisition, if it loses the network or has just been powered on. The following discussion thus applies only to the master.

The master starts at the highest bit rate. A figure of merit for network performance is maintained as follows, and is updated each time a packet is received:

$$BRCNT(N) = BRCNT(N - 1) + 1 \quad \text{if packet retry occurs}$$
$$= BRCNT(N - 1)/2 \quad \text{if packet received without retry}$$

BRCNT is an 8 bit number. If BRCNT exceeds a upper threshold, then the bit rate is decreased, unless the lowest bit rate is already in use. In this case, frequency is changed. If BRCNT drops below a lower threshold, then bit rate is increased. If bit rate is maximum, only the first threshold applies.

Figure 11:
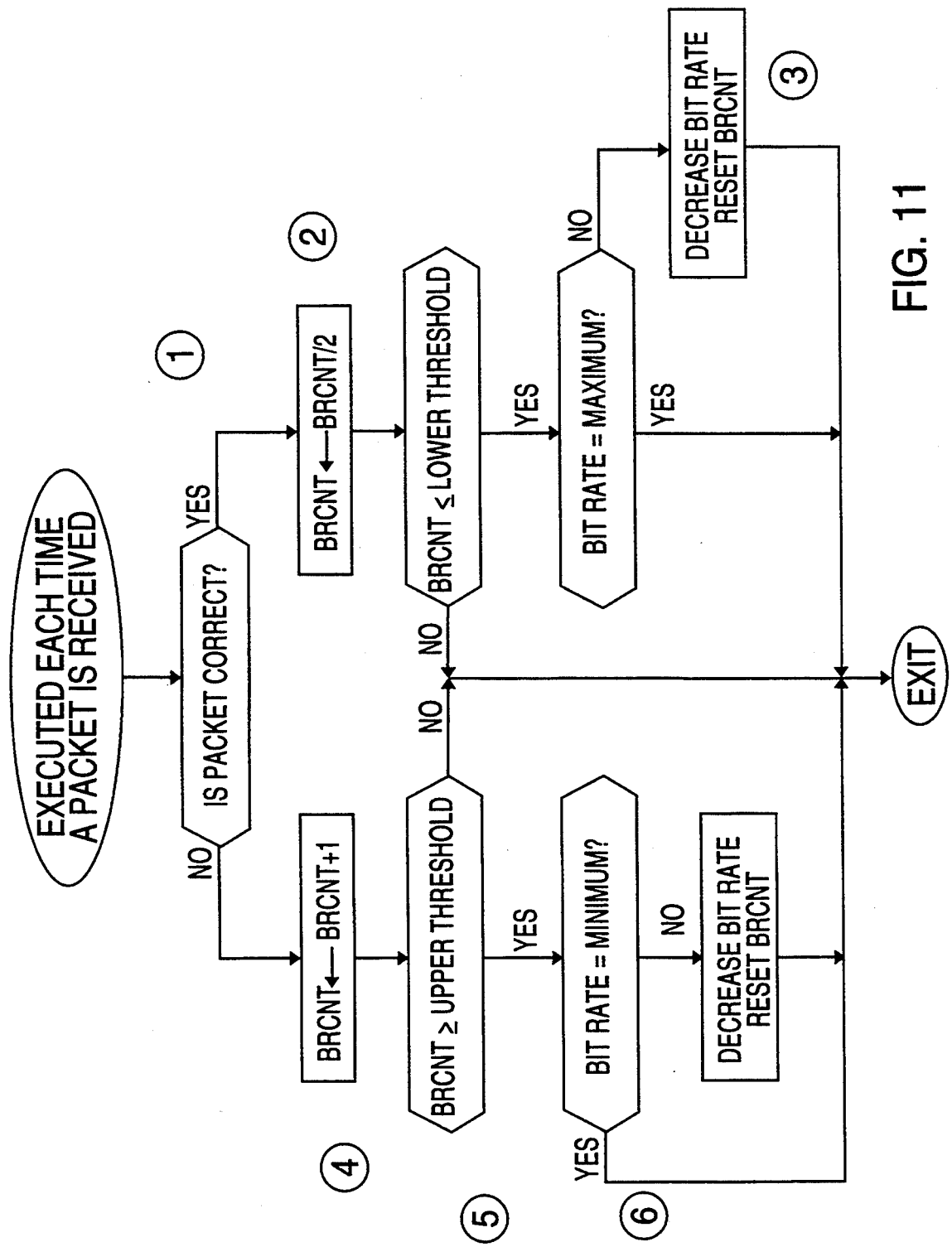
FIG. 11 is flow chart of the bit rate logic of the system of FIG. 1.

This is illustrated as a flow chart in FIG. 11. Each time a packet is received, a change is made to the BRCNT variable. The effect of a correct packet is stronger than the effect of an incorrect packet; it reduces the count by a factor of two (see (2) on FIG. 11). The new value of the BRCNT variable is compared with a threshold, and bit rate increased, unless already maximum, when the threshold is reached (3).

Similarly, a series of bad packets will increase BRCNT (4), and produce a decrease in bit rate when an upper threshold is reached (5). If the logic calls for a lower than the lowest bit rate, then the frequency channel change algorithm is invoked (6).

FREQUENCY OPTIMIZATION (TUNE SELECTION)

Figure 12:
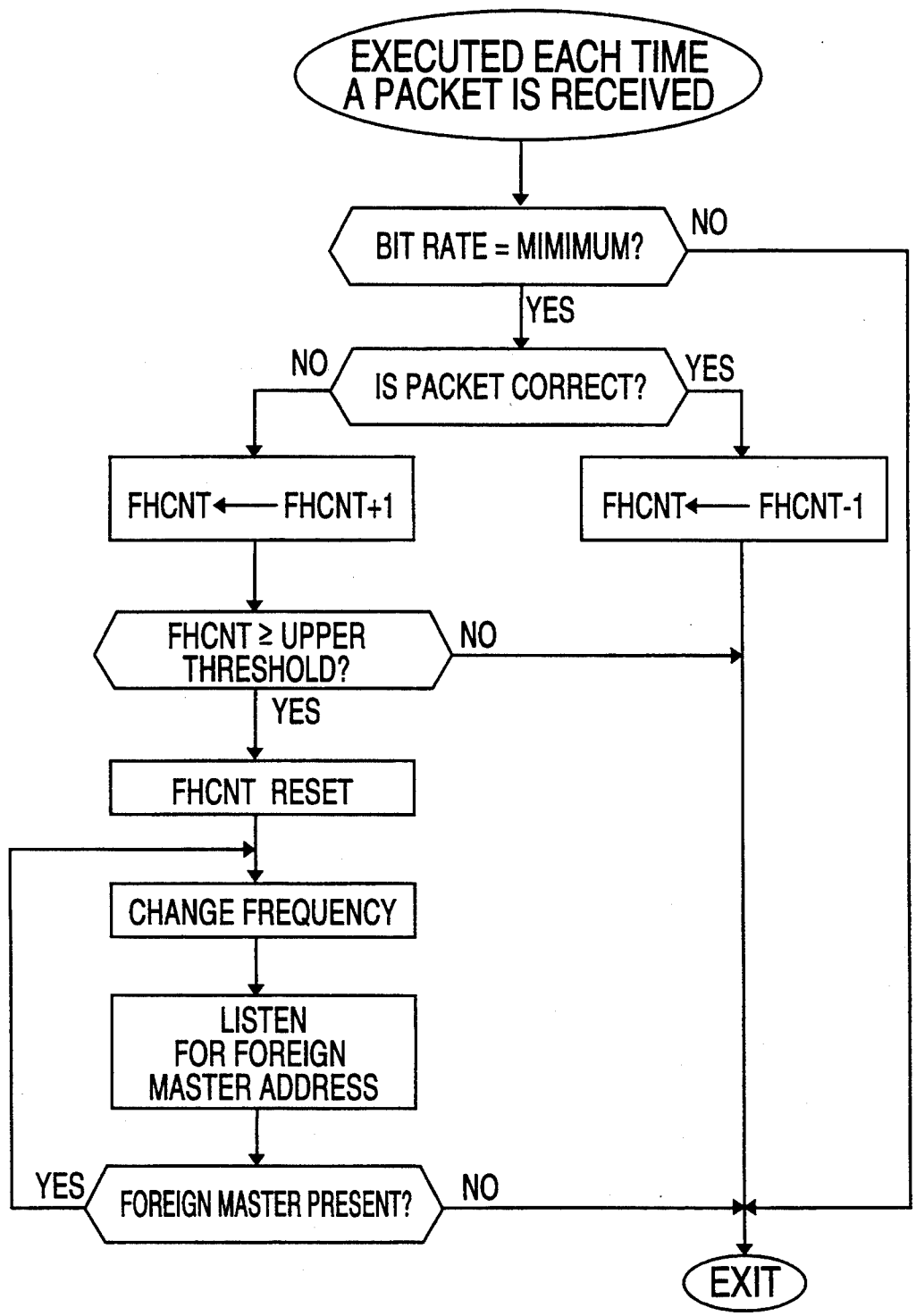
FIG. 12 is a flow chart of the frequency hopping logic of the system of FIG. 1.

The master starts the network at the highest frequency channel not occupied by another master address. It will drop to another frequency channel if the system is currently operating on the lowest bit rate, and a figure of merit, FHCNT, exceeds a threshold. FHCNT is calculated similarly to BRCNT, as a function of packet retries. The master will rotate through available frequency channels; collision with existing networks with other master addresses will be treated in the same way as unacceptable FHCNT, resulting in shift to another frequency channel. The logic is shown in FIG. 12.

BIT RATE AND TUNE CHANGE COMMUNICATION TO SLAVES

The current bit rate and frequency are designated in each packet. When a change is requested by the master, it transmits four packets with the new code on the old bit rate and frequency, and then changes to the new set. Those slaves hearing the packets change immediately; those that do not lose the network, and enter the network acquisition routine.

SYNCHRONIZATION AND NETWORK ACQUISITION BY SLAVES

Figure 13:
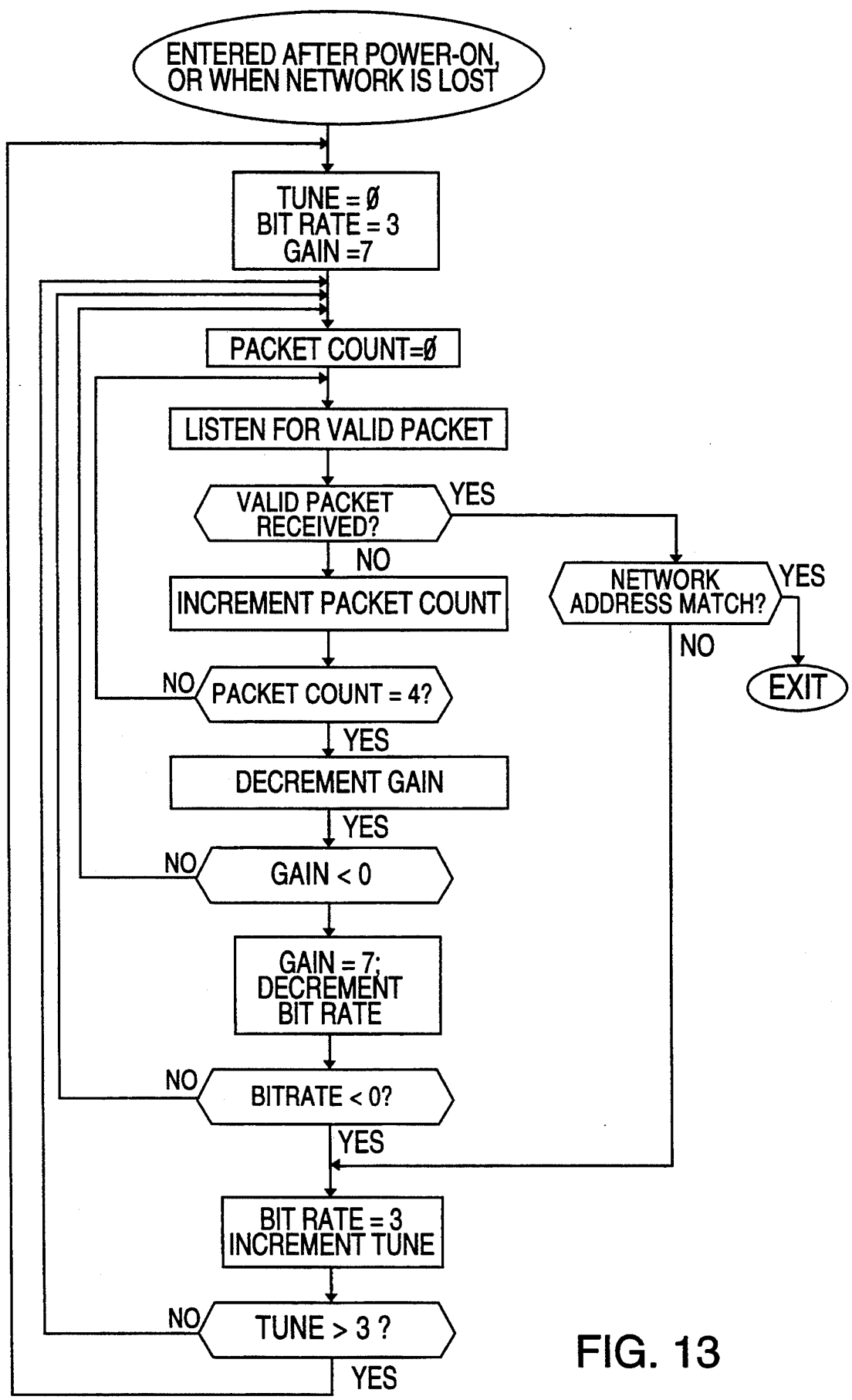
FIG. 13 is a flow chart of the slave network acquisition logic of the system of FIG. 1.

This section describes the process through which a network is initialized, and through which additional subscribers join the network.
Slave Initialization Upon initialization, a slave must search for and find the tune and bit rate currently in use. It proceeds as described below, and illustrated in FIG. 13.

All tunes are searched, starting with the highest. Within each tune search, bit rate is searched, starting with the highest. Within each bit rate, gain is searched highest to lowest. If a valid (error code checks correct) sequence is obtained during this process, then the slave knows the tune and switches to it, entering run mode. If not, the slave proceeds to search the tunes bit rates and gains, remaining on each combination for four packet times. This process is repeated until a valid packet is received.
Master Initialization The master starts by performing the slave initialization sequence to see if a network with the same network address already exists. If so, it is internally disabled. This is intended to prevent seizure of a network by a master in malevolent hands.

Figure 14:
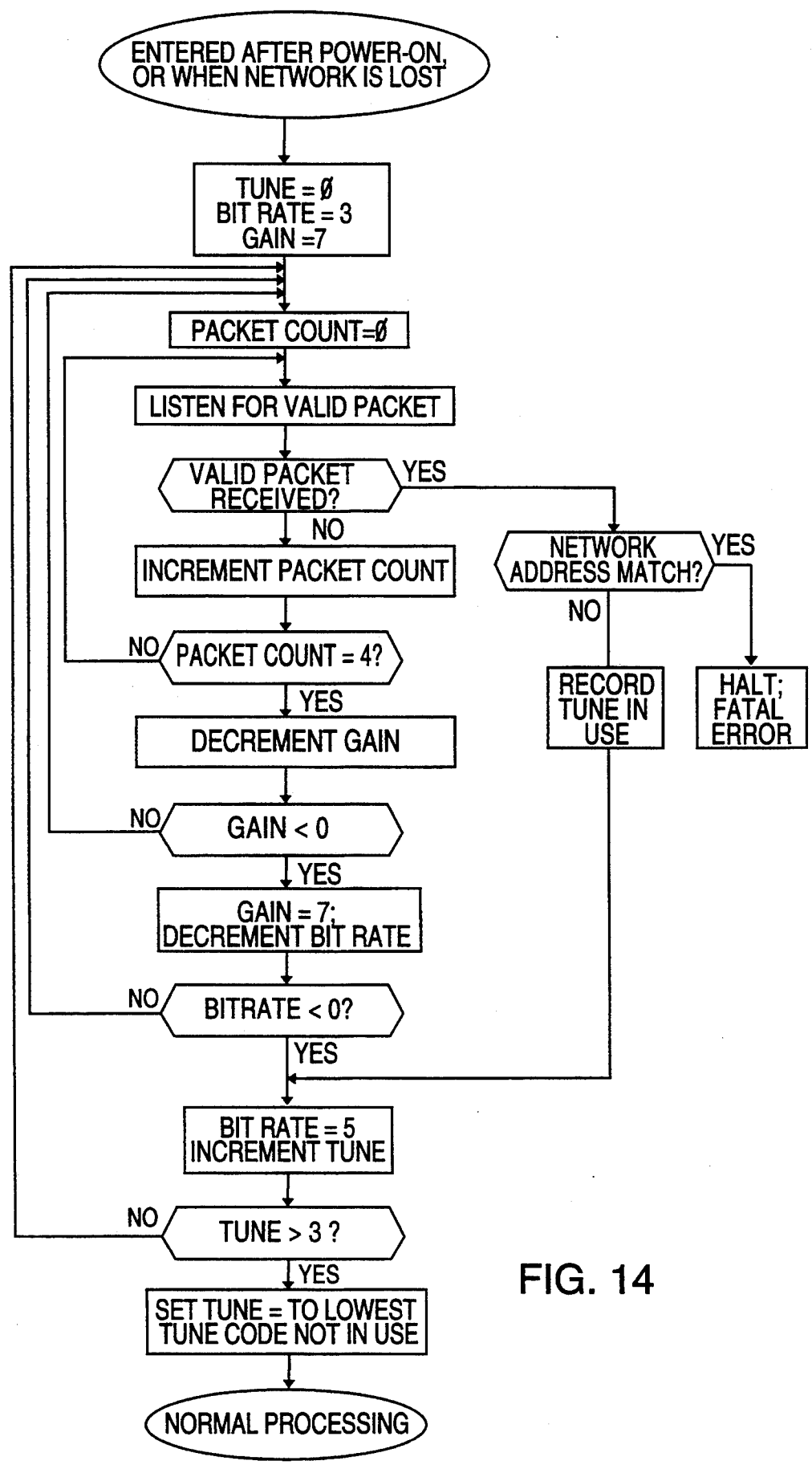
FIG. 14 is a flow chart of the master network acquisition logic of the system of FIG. 1.

If the master cannot find a slave with its own network address, it will proceed to the next frequency channel, and repeat the process. This is shown in FIG. 14.
Network Runtime Operation In order to keep the system gain and tune selection optimal, the network will always be active. In network mode, the master runs internal test (software loopback) whenever there is no host traffic required.

Software loopback or test mode will operate as follows: For the first cycle, the master will attempt to access all 255 slave addresses. Subsequently it will scan only up to the highest address which responded. Every TBD cycles, it will search the full set. (It is required that the user pack addresses contiguously upward from 1 for efficient operation). Each time it accesses a slave, it will send a packet of test data which the slave will echo. The master will process to the next slave address upon correct receipt of the echo.

Once a network is established with one or more slaves, the tune control will be performed as described above.

ERROR CODING AND TIME DIVERSITY

In addition to frequency-dependent noise which will be combated by the adaptive frequency hopping described above, power lines are characterized by impulsive noise, which by definition occupies all frequency bands for relatively short periods, often less than one bit time. This noise, tends to be 100 or 120 Hz synchronous, due to its origin.

In network mode and in the software loopback function of transparent mode, two techniques are employed to reduce sensitivity to impulse noise: error detection coding, and saving those bytes of a block which were not corrupted, so that on a subsequent retry a complete message will exist at the receiver unless the same portion is hit on successive tries. The timing of successive tries is arbitrary due to variable block length, and it is likely that 100 or 120 hz synchronous disturbance will not hit the same message portion on successive attempts.
Error Correction A 27 bit error code is employed, consisting of three bytes plus byte parity. They consist of a cumulative XOR of the bytes in the packet, followed by an XOR of the bytes in the packet with a one-byte left rotate after each byte is added, followed by an XOR of the bytes in the packet with a right rotate after each XOR. This allows implementation in software in real time, and provides good performance with the overlay technique. In implementations with a more powerful processor, a stronger code will be appropriate.
Overlay of Retries If a given byte of a packet can not be corrected, the receiver will continue to collect data for the remainder of the packet, and will store those bytes subject to successful error correction in the receive buffer. However, if the first byte, which contains the packet length, is corrupted, the packet must be abandoned.)

Figure 15:
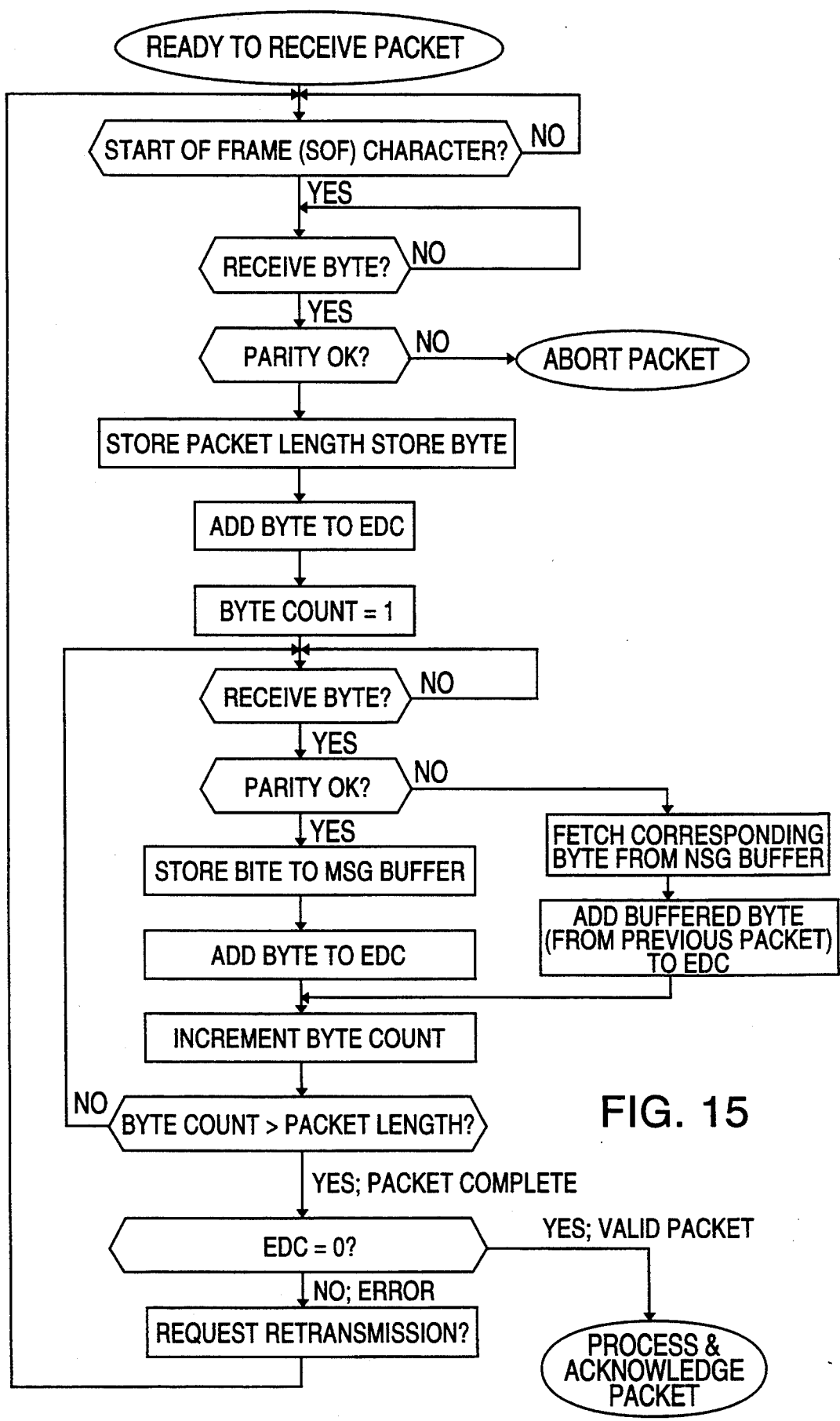
FIG. 15 is a flow chart of the packet overlay logic of the system of FIG. 1.

On subsequent retries, if a byte is in error, it will not be written to the receive buffer, but the byte already stored from the previous retry will be incorporated in the running checksum. At the end of the packet, if the checksum is found to be valid, then a complete valid packet has been assembled from two or more transmissions, and it will be processed as such. This logic is shown in detail in FIG. 15.

This approach allows the system to communicate successfully even in a noise environment which precludes a packet from ever being received with only correctable errors, as long as each byte gets through once.

LINK LEVEL OPERATION

This section describes the operation of the link layer of the system, separately for transparent mode and network mode.

TRANSPARENT MODE

Transparent mode is extremely simple: Data transmitted into the master by its host is transferred to the network as a modulated bit stream, which is decoded by all slaves which can hear it and output as serial data to their hosts. Similarly, data transmitted into a slave by its host is transferred across the network and comes out all other units.

There is no addressing function, error detection or correction, or bus access control implemented in the system in this mode; these must be supplied by the user.

One restriction is imposed on the host network: all transmissions must be initiated by the master. The reason for this is to allow the system to use idle periods for network optimization. This process consists of polling each slave in succession, obtaining a loopback of data, and reports of channel quality from each slave. This information is used by the physical layer routines to control gain and tune selection.

NETWORK MODE

Network mode implements a polled, master slave system capable of both cyclic polling operation and of a point-to-point connection.

Error free logical links are provided in both cases.
Protocol Syntax

Figure 16:
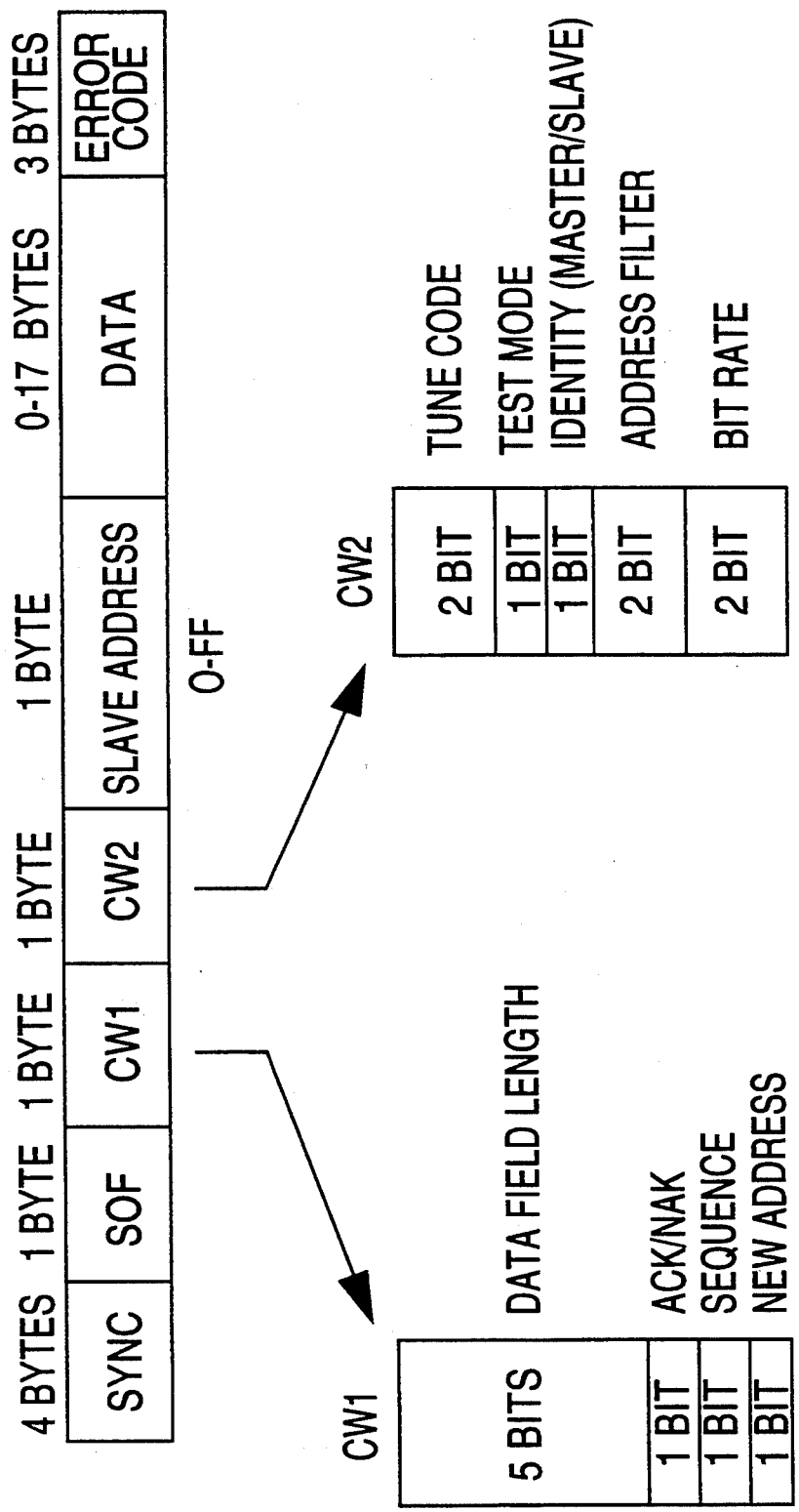
FIG. 16 is a diagram of the packet format used in the system of FIG. 1.

Data is transferred in packets. Each packet is comprised of four bytes plus 0 to 17 data bytes, with the quantity variable. Each byte is supplemented by a parity bit. This is illustrated in FIG. 16. The fields are:

| sync pattern | (4 bytes) |
| --- | --- |
| start of frame | (SOF, 1 byte) |
| control_1 | (CW1, 1 byte) |
| control_2 | (CW2, 1 byte) |
| slave address | (1 byte) |
| data | (0–17 bytes) |
| block error detection code | (3 bytes) |

The control_1 byte is further subdivided as follows:

| bits 0–3 | data byte count (0–15 decimal) |
| --- | --- |
| bit 4 | ack/nak |
| bit 5 | sequence |
| bit 6 | new_address |
| bit 7 | test_mode |

Packets are of variable length, and the length (in terms of data bytes) is the lower nibble of the control byte. The ack/nak bit is used to command retransmission of a destroyed block.

The sequence bit allows the system to avoid confusing retries with new data.

The new_address bit is 1 on the first block being sent to a slave in a particular link process; it signals to the slave that this is a new link.

The slave address field is used by the slave to match messages intended for it. It ignores messages not bearing its own address, with the exception of address 0.

Address 0 is used for broadcast: All slaves accept a message with this address, but none respond to it.

The control_2 byte is organized as follows:

| bits 0–1 | tune code (master); noise level (slave) |
| --- | --- |
| bit 2–3 | bit rate code |
| bit 4 | flow control nak |
| bit 5 | master originating |
| bits 6–7 | master address |

The tune code is a 2-bit code denoting the tune currently in use by the network. It is followed by a another 2-bit code for bit rate.

The next bit is used by the slave to indicate that although the link is good, the slave's host is not accepting data as fast as it is being delivered, due to flow control or a difference in data rates, and that the master should therefore send no new data, although it may keep the link active.

The next bit indicates origin of the message: 1 for master, and zero for slave.

The top 2 bits of this byte specify one of 8 master (or network) addresses. These are used to allow concurrent operation of multiple, independent networks on the same physical channel without confusion, either for store-and-forward purposes or to allow increased use of the bandwidth.

In installations where there is only one network, it is also possible to use it as a key to enable content-oriented addressing.

The error code is appended at the end of the packet, and is used to verify validity of the whole packet. Different words of the packet may have been delivered on different retires of the packet in a noisy environment.

PROTOCOL SEMANTICS

The protocol implements the various link commands described below. These allow creation of three types of links:
network test
polling cycle
Continuous link Network test can be viewed as a special case of a polling cycle, in which data is not transferred to the host device.

Polling is in turn a special case of the continuous link, in which the link is discontinued automatically after receipt of one valid packet from the slave, and the next slave in the specified range is then connected. It shares the same routines for circuit establishment and error control. These routines are essentially the same as those described in U.S. Pat. No. 4,597,082.

HOST COMMAND SYNTAX

Additional detail follows on the structure of commands which may be issued to the master by the master's host. The master distinguished the commands from data by the status of the control/data line.

In addition to the command responses noted, the system will assert its ERROR pin (or BREAK if in serial mode) if an illegal command or syntax is received.

The slave does not accept or act on commands except for STATUS and EXTERNAL FH. If its control/data line is in control state, it treats data received as a destination address to be included in subsequent packets. If its internal buffer (15 bytes) is filled, subsequent data will be ignored, and additional writes to the chip will produce an error.
Network Test This mode sends a packet to each slave within the specified range; the slave performs a software loopback to the master; the master checks for errors and reports error rate. The same block-ahead acknowledgment protocol will be used as in the case of polling and transparent link communications. The primary purpose of this mode is to provide current data a spectrum performance so the FH algorithms will remain optimized in periods of low useage.

| | |
|---|---|
| It 1 | executes until another command is received. |
| POLLING CYCLE | |
| Command response: | <status> <address> <data> ... <status> <address> <data> ... <EOF marker> |

Status shows success or failure to communicate with indicated address. Data from slave follows address is successful; otherwise subsequent slave's report follows.

<data> denotes data which the designated slave has received since the last time it was polled, up to one full packet size Transparent Point-to-point Link This command establishes a point-to-point, error-free, positively acknowledged link to a single slave. Once it is established, data entered in the data port of either master or slave comes out the other.

| | |
|---|---|
| Command syntax: | <op code> <address> |
| Command response: | <address> <link status> |

Link status is success or failure in establishing the link.

If a link is broken after it has been establsihed, the ERROR pin will be asserted (parallel mode) or a BREAK character will be output (serial mode).

Link remains in effect until another valid command is received.

The unit contains 15 bytes of buffering. If the input data rate is such that this buffer is filled, the TRANSMIT BUFFER AVAILABLE line will not be asserted, providing flow control.

Broadcast

This command is identical to the transparent link, except that no acknowledgment is expected or received from slaves.

The broadcast address is 00. Any unit receiving data addressed to 00 will output it to its host, if it is free if errors after error correction.

| | |
|---|---|
| Command syntax: | <op code> <address> |
| Command response: | <address> <link status> |
| <Link status > is always OK. | |

Initialization command

Upon power-up or hardware reset, the system must receive an initialization sequence or it will do nothing. This sequence tells it whether it is a master or slave. If a slave, it also tell it its address, and an address filter (applied to the destination address field in received packets) to be used in passing network data bearing other addressed to its host. If it is a master, it is told the address range over which the system is working.

If initialized as a slave, the only commands accepted are initialization and status request.

| |
|---|
| command syntax to slave: <op code> <master/slave> <own address> <destination address filter> |
| command syntax to master: <op code> <master/slave> <low address> <destination address filter> |
| command response: none |

Status Request

Two status requests are available: chip status and link status.

Chip status indicates the current state of the chip, and may be used by the host to obtain additional information when the ERROR pin (or serial BREAK) is asserted.

| | |
|---|---|
| command syntax: | <op code> |
| command response | <link type> <flow control status> <error codes to be determined> |

The link status command, valid for both master and slave, causes output of current FH tune, and relative error rate data on the frequencies of the tune, each expressed as a two-byte number.

| | |
|---|---|
| command syntax: | <op code> |
| command response: | <own address> <destination address filter> <FH tune id> <f1 error rate> <f2 error rate> <f3 error rate> |

External FH Command

This command, allows external setting of the frequency set in use. It over-rides the internal FH algorithms, for test and debug purposes, and to allow operation of the system on a fixed-frequency basis for compatibility with possible future, fixed-frequency nodes.

| |
|---|
| Command syntax: <op code> <frequency to use> | if "0" is entered in the frequency field, the internal FH algorithms will be re-enabled.

| |
|---|
| command response: none |

External Bit Rate Command

This command, allows external setting of the bit rate set in use. It over-rides the internal FH algorithms, for test and debug purposes, and to allow operation of the system on a fixed-frequency basis for compatibility with possible future, fixed-frequency nodes.

| |
|---|
| Command syntax: <op code> <bit rate to use> | if "0" is entered in the bit rate field, the internal FH algorithms will be re-enabled.

| |
|---|
| command response: none |

The IC/SS ™ chip set comprising the IC/SS ™ analog chip ICSS ™ 1003, IC/SS ™ digital chip ICSS ™ 1002, and the IC/SS ™ controller chip ICSS ™ 1001 are manufactured by National Semiconductor Corporation of Santa Clara, Calif. The ICSS ™ 1001 chip is a programmed National Semiconductor COP884EG microcontroller that controls the adaptive gain setting, bit rate setting, frequency hopping, host interface, and link layer protocols.

The features of the invention could also be realized in hard logic or by other computer means.

It will thus be seen that the objects set forth above, among those made apparent from the preceding description are efficiently attained and since certain changes may be made in the above systems and constructions without departing from the scope of the invention, it is intended that all matter contained in the above description or shown in the accompanying drawings shall be interpreted as illustrative and not in a limiting sense.

It is also understood that the following claims are intended to cover all of the generic and specific features of the invention herein described, and all statements of the scope of the invention which, as a matter of language, might be said to fall therebetween.

Having described my invention, what I claim as new and desire to secure by Letters Patent is:

1. A communications system comprising at least one receiver employing automatic gain control for receiving binary coded parity checked information in successive packets; said receiver comprising:
    A) means for determining the bit error rate occurring in received packets by analyzing said packets for errors over a selected sample period of a plurality of successive sample periods; and storing said rate;
    B) means for comparing said bit error rate with the bit error rate in a sample period occurring before said selected sample period; and
    C) means for changing the gain of the receiver in the same direction that it was changed previously when the current bit error rate is less than the previously measured bit error rate and for changing the gain in the opposite direction when the current bit error rate is greater than the previously measured bit error rate.

2. The system defined in claim 1 and
    D) means for keeping the gain at the same setting for a predetermined number of successive ones of said sample periods after changing the gain in said opposite direction.

3. The system defined in claim 2 wherein said sample period is a number of packets received.

4. The system defined in claim 1 wherein said sample period is a number of packets received.

5. A communciations system as defined in claim 1 further comprising a transmitter and wherein binary coded information packets including error codes are transmitted from the transmitter to the receiver on at least one of a plurality of modulated frequencies and the receiver transmits to the transmitter an error signal when the receiver determines that a packet was received with an error; said transmitter comprising:
    A) means for setting the transmission bit rate at one of a plurality of bit rates between upper and lower limits;
    B) means for maintaining a variable related to bit error rate (BRCNT), having upper and lower limits, and updated as follows, where (N−1) indicates the current BRCNT value and (N) indicates the new BRCNT value $$BRCNT(N) = BRCNT(N - 1) + 1 \quad \text{when a packet was received with an error}$$
$$= BRCNT(N - 1)/2 \quad \text{when a packet was received without an error}$$

and for decrementing the setting of said bit rate when the BRCNT reaches said upper limit and for incrementing the setting of said bit rate when said BRCNT reaches said lower limit; and
    C) means for changing at least one frequency used in the next packet transmission when the BRCNT reaches said upper limit and the bit rate used in the error containing packet was the lowest bit rate available.

6. A communication system as defined in claim 5 comprising a plurality of slave modems each comprising a receiver substantially identical to said receiver and each connected to a host, said receiver further comprising:
    A) means for receiving binary coded information packets on said plurality of modulated frequencies;
    B) means for searching said frequencies for packets containing one of a plurality of master addresses and for only transmitting to its host packets containing said one master address.

7. A communication system as defined in claim 6 and
    C) a master modem having a specific master address and comprising
        a) means for searching said channels for and, disabling itself when, a packet is received containing said specific master modem address from another master.

8. A communication system as defined in claim 1 comprising a plurality of slave modems each comprising a receiver substantially identical to said receiver and each connected to a host, said receiver further comprising:
    A) means for receiving binary coded information packets on said plurality of modulated frequencies;
    B) means for searching said frequencies for packets containing one of a plurality of master addresses and for only transmitting to its host packets containing said one master address.

9. A communciations system comprising a transmitter and receiver wherein binary coded information packets including error codes are transmitted from a transmitter to a receiver on at least one of a plurality of modulated frequencies and the receiver transmits to the transmitter an error signal when the receiver determines that a packet was received with an error; said transmitter comprising:
    A) means for setting the transmission bit rate at one of a plurality of bit rates between upper and lower limits;
    B) means for maintaining a variable related to bit error rate (BRCNT), having upper and lower limits, and updated as follows, where (N−1) indicates the current BRCNT value and (N) indicates the new BRCNT value $$BRCNT(N) = BRCNT(N - 1) + 1 \quad \text{when a packet was received with an error}$$
$$BRCNT(N) = BRCNT(N - 1)/2 \quad \text{when a packet was received without an error}$$

and for decrementing the setting of said bit rate when the BRCNT reaches said upper limit and for incrementing the setting of said bit rate when said BRCNT reaches said lower limit; and
    C) means for changing at least one frequency used in the next packet transmission when the BRCNT reaches said upper limit and the bit rate used in the error containing packet was the lowest bit rate available.

10. A communication system as defined in claim 9 wherein said receiver utilizes integrate and dump bit detection.

11. A communication system comprising a plurality of slave modems each connected to a host comprising:
A) means for receiving binary coded information packets on a plurality of communication channels;
B) means for searching said channels for packets containing one of a plurality of master addresses and for only transmitting to its host packets containing said master address; and,
C) a master modem having a specific master address and comprising
a) means for searching said channels for and, disabling itself when, a packet is received containing said specific master modem address from another master.

* * * * *